(12) United States Patent
Akaogi et al.

(10) Patent No.: US 6,621,761 B2
(45) Date of Patent: Sep. 16, 2003

(54) BURST ARCHITECTURE FOR A FLASH MEMORY

(75) Inventors: Takao Akaogi, Cupertino, CA (US); Lee Cleveland, Santa Clara, CA (US); Kendra Nguyen, San Jose, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 162 days.

(21) Appl. No.: 09/829,518

(22) Filed: Apr. 9, 2001

(65) Prior Publication Data

US 2002/0012278 A1 Jan. 31, 2002

Related U.S. Application Data

(60) Provisional application No. 60/208,652, filed on May 31, 2000.

(51) Int. Cl.[7] ............................ G06C 8/00; G11C 16/00
(52) U.S. Cl. ............. 365/233; 365/230.06; 365/230.09; 365/193; 365/185.01; 711/103; 711/167
(58) Field of Search ................... 365/185.01, 185.33, 365/189.01, 230.08, 230.09, 233, 230.06, 193; 711/167, 169, 170, 217, 218, 219, 103

(56) References Cited

U.S. PATENT DOCUMENTS

| | | | | |
|---|---|---|---|---|
| 5,604,884 A | * | 2/1997 | Thome et al. | 711/167 |
| 5,781,500 A | * | 7/1998 | Oh | 365/233 |
| 5,838,990 A | * | 11/1998 | Park et al. | 710/14 |
| 5,867,447 A | * | 2/1999 | Koshikawa | 365/233 |
| 5,923,615 A | * | 7/1999 | Leach et al. | 365/238.5 |
| 6,104,667 A | * | 8/2000 | Akaogi | 365/233 |
| 6,108,243 A | | 8/2000 | Suzuki et al. | 365/189.01 |
| 6,111,787 A | * | 8/2000 | Akaogi et al. | 365/185.11 |
| 6,147,905 A | | 11/2000 | Seino | 365/185.11 |
| 6,172,936 B1 | * | 1/2001 | Kitazaki | 365/233 |
| 6,205,084 B1 | * | 3/2001 | Akaogi | 365/233 |
| 6,215,722 B1 | * | 4/2001 | Park | 365/230.06 |
| 6,216,180 B1 | * | 4/2001 | Kendall et al. | 710/35 |
| 6,222,767 B1 | * | 4/2001 | Kendall et al. | 365/185.12 |
| 6,285,585 B1 | * | 9/2001 | Kurihara et al. | 365/185.08 |
| 6,304,510 B1 | * | 10/2001 | Nobunaga et al. | 365/230.06 |
| 6,314,049 B1 | * | 11/2001 | Roohparvar | 365/233 |
| 6,385,688 B1 | * | 5/2002 | Mills et al. | 711/103 |

FOREIGN PATENT DOCUMENTS

EP 0 821 363 A2 1/1998 ............ G11C/7/00

\* cited by examiner

Primary Examiner—Hong Kim

(57) ABSTRACT

A burst mode architecture to provide burst mode access to a plurality of data words in a flash memory is described. The burst mode architecture includes a first circuit, a control circuit coupled to the first circuit, and a data buffer selectively coupled to the first circuit by the control circuit. The first circuit accesses a plurality of data words, beginning with an initial access of a first data word and a second data word. The control circuit generates a timing signal having pulses and a second signal. The second signal is generated upon completion of the initial access of the first data word and the second data word. The first circuit follows the initial access with subsequent accesses of the plurality of data words responsively to the second signal and the timing signal. The data buffer has an output and produces the first data word at the output and successively produces, with each successive pulse of the timing signal following an initial period of time, the second data word, and subsequent data words at the output. The subsequent data words correspond to the subsequent accesses of the plurality of data words.

16 Claims, 11 Drawing Sheets

BURST ARCHITECTURE FOR A FLASH MEMORY

This application claims benefit of provisional application serial No. 60/208652 filed May 31, 2000.

BACKGROUND

The present invention relates generally to semiconductor memory devices. More particularly, the present invention relates to a burst architecture for a flash memory.

Flash random access memory (RAM), more commonly known as flash memory, is a form of non-volatile storage that uses a memory cell design with a floating gate. High voltages are applied to the memory cell inputs to program or store charge on the floating gate or to erase or remove charge from the floating gate. Programming occurs by hot electron transfer to place charge on the floating gate while erasure makes use of Fowler-Nordheim tunneling in which electrons pierce a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Flash memories are asked to meet continually increasing standards of system performance. One area where opportunities lie to increase the performance of flash memory is the area of burst mode flash memory. It would be desirable to implement a high performance flash memory capable of improved burst mode operation.

DETAILED DESCRIPTION OF THE PRESENTLY PREFERRED EMBODIMENTS

Flash memories are required to meet continually increasing standards of system performance. One area where opportunities lie to increase the performance of flash memory is the area of burst mode flash memory. The presently preferred embodiments described herein implement a high performance flash memory capable of improved burst mode operation.

In general terms, a burst mode operation involves producing data, preferably in the form of data words, at the output of the memory in synchronization with a clock or a timing signal. The locations of core memory cells where the data are stored are accessed via core cell address and decoding logic. In burst mode operation, an initial address is supplied to or generated by the memory. Typically, subsequent addresses corresponding to core cell locations are internally generated by the memory, rather than received by the memory from a source external to the memory. Ultimately, data in the form of data words, stored in core cell locations that correspond to these initial and subsequent internally generated addresses, are produced at the output of the memory in synchronization with a timing signal.

Figure 1:
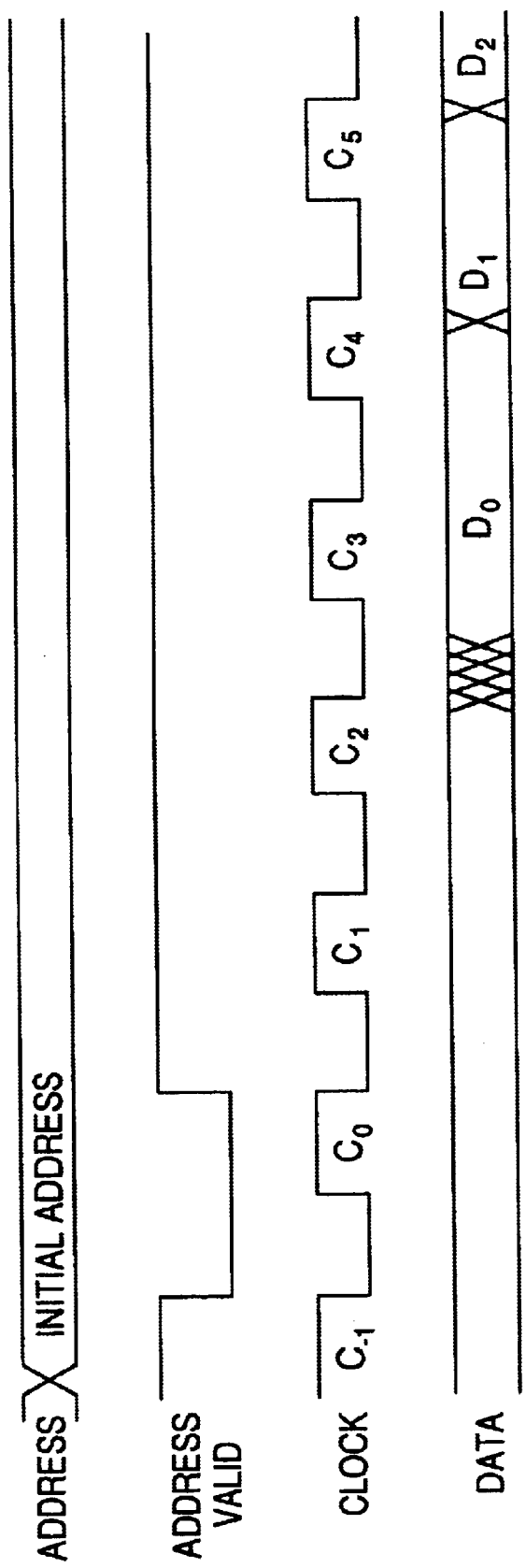
FIG. 1 is a timing diagram illustrating the basic operation of an exemplary burst mode access function in a memory.

FIG. 1 is a timing diagram illustrating the basic operation of an exemplary burst mode access function in a memory. In the case of a burst operation, an initial address is presented to an input of the memory and is represented in FIG. 1 as a signal ADDRESS. In general, the initial address will be a multiple-bit signal. An ADDRESS VALID signal that is responsive to a valid initial address is normally high but goes low to indicate that a valid initial address has been presented to the memory. The ADDRESS VALID signal is thus a low active signal. A CLOCK signal provides timing for the burst operation. The clock pulses of the CLOCK signal shown in FIG. 1 are labeled $C_{-1}$, $C_0$, $C_1$, $C_2$, $C_3$, $C_4$, and $C_5$, respectively. A DATA signal represents the information that appears at an output of the memory. In general, each bit of output corresponds to the information stored in a core memory cell of the memory. Typically, the DATA signal will be a multiple-bit signal corresponding to the information stored in a series of core memory cells of the memory. The cross-hatched area in FIG. 1 represent the boundary of a don't care area where the value of the DATA signal is indeterminate and/or not relevant to circuit operation.

The overall operation of the memory proceeds responsively to a valid initial address applied at an input of the memory. The ADDRESS VALID signal loads the given valid initial ADDRESS signal into the memory at the falling edge of the ADDRESS VALID signal. At the rising edge of the clock pulse $C_0$ of the CLOCK signal, the initial address is latched or stored in the memory, in an address buffer, for example. At the first falling edge of the CLOCK signal after the ADDRESS VALID signal goes low active, in this case, the falling edge of the clock pulse $C_0$, the ADDRESS VALID signal goes to its rest state value of high.

The period of time between the falling edge of the ADDRESS VALID signal and the rising edge of clock pulse $C_4$ of the CLOCK signal is called the initial state. During the initial state, the memory has to be ready for burst operation. The initial state will include a certain number N of clock pulses.

Following the number N of clock pulses (in FIG. 1, the number N is four), data words are clocked out of the memory at every rising edge of the CLOCK signal. Preferably, the number N of clock pulses will be preset by the system. In order that the system functions properly, the first data $D_0$ should be ready and valid before the rising edge of the clock pulse $C_4$ so that the system can send out the first data $D_0$ at or following the rising edge of the clock pulse $C_4$. The second data $D_1$, should be ready before the rising edge of the clock pulse $C_5$. Similarly, the third data $D_2$ should be ready before the rising edge of the next clock pulse (not shown in FIG. 1) of the CLOCK signal, and so on. The presently preferred embodiment and other embodiments and variations thereof provide the architecture to realize this burst mode function effectively.

Figure 2:
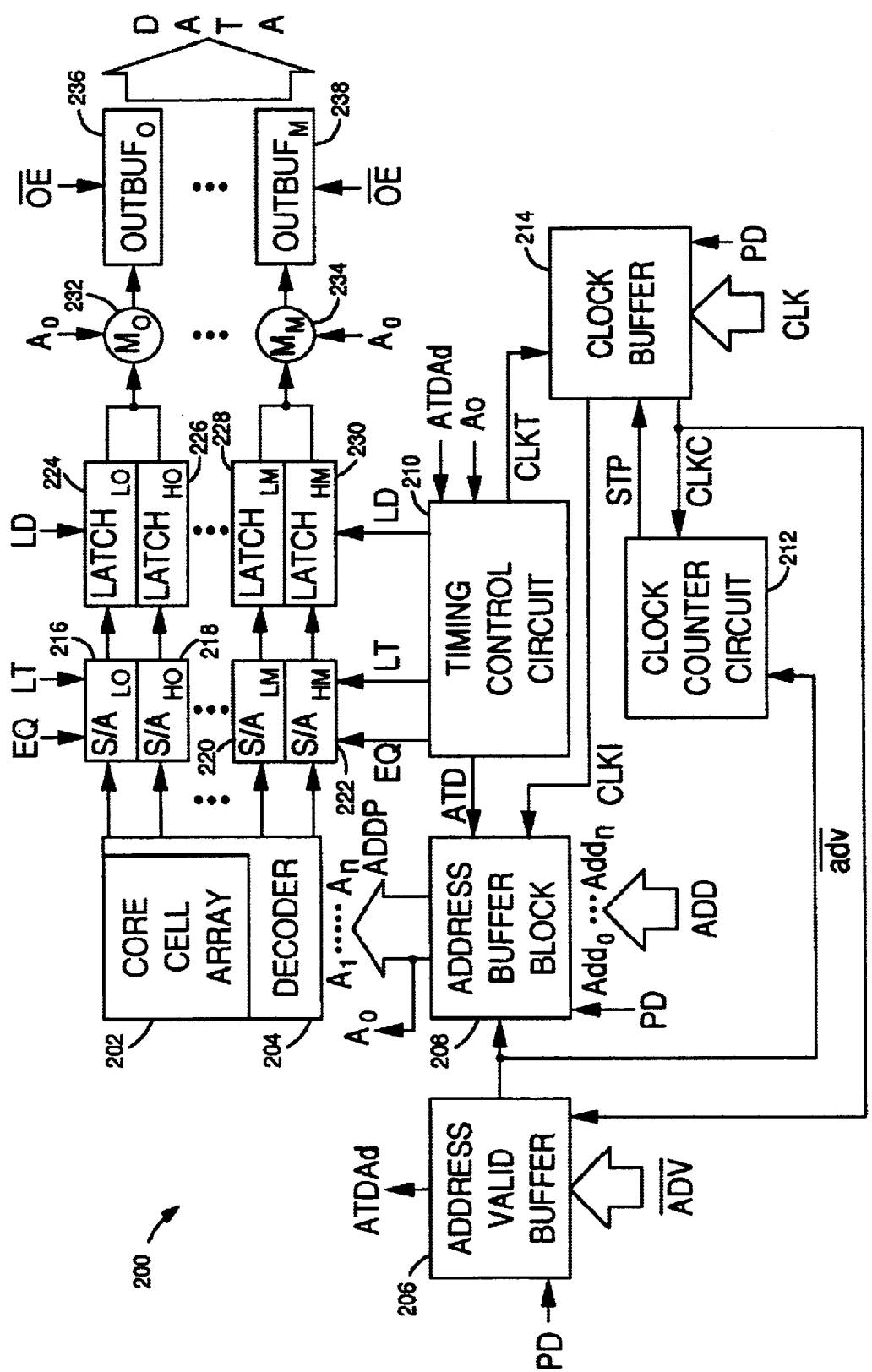
FIG. 2 is a block diagram of a memory incorporating an exemplary burst mode architecture according to a presently preferred embodiment.

Referring now to FIG. 2, it shows a block diagram of a memory 200. In the illustrated embodiment, the memory 200 is configured as a flash memory formed as a complementary metal-oxide-semiconductor (CMOS) integrated circuit for storing digital data. However, the memory 200 may take any other suitable form and in fact the principles described herein may be applied in any other suitable circuit in which a portion of the performance of the circuit involves a burst mode operation. The memory 200 incorporates an exemplary burst mode architecture according to a presently preferred embodiment. The memory 200 includes a core cell array 202, a decoder 204, an address valid buffer 206, an address buffer block 208, a timing control circuit 210, a clock counter circuit 212, a clock buffer 214, a first series of sense amplifiers beginning with $S/A_{LO}$ 216 and ending with $S/A_{LM}$ 220, a second series of sense amplifiers beginning with $S/A_{HO}$ 218 and ending with $S/A_{HM}$ 222, a series of latches beginning with $LATCH_{LO}$ 224 and $LATCH_{HO}$ 226 and ending with $LATCH_{LM}$ 228 and $LATCH_{HM}$ 230, a series of data multiplexers beginning with $M_O$ 232 and ending with $M_M$ 234, and a series of output buffers beginning with $OUTBUF_O$ 236 and ending with $OUTBUF_M$ 238.

An input signal PD is a power down signal used to power down the memory 200. In particular, the input signal PD is applied at an input, preferably an external input, of the memory 200 and is received at the address valid buffer 206, the address buffer block 208, and the clock buffer 214. When the input signal PD is at a logic high, the input signal PD effectively disables the various buffer circuitry 206, 208, 214. Preferably, when the input signal PD is a logic low, the memory 200 and the various buffer circuitry 206, 208, 214 are enabled.

A clock or timing signal CLK is applied at an input, preferably an external input, of the memory 200 and is received at the clock buffer 214. The clock signal CLK may be tied to, for example, a system or a microprocessor clock operating external to the memory 200. Preferably, the CLK signal provides the fundamental timing and the internal operating frequency for the memory 200. Preferably, other clocks or timing signals are generated in whole or in part from the CLK signal, as described herein. For example, the CLKC signal is a timing signal that is generated by the clock buffer 214 and that is provided to the clock counter circuit 212 and the address valid buffer 206. When the input signal PD is at a logic low and the memory 200 is enabled, the CLKC signal follows the CLK signal.

Figure 7:
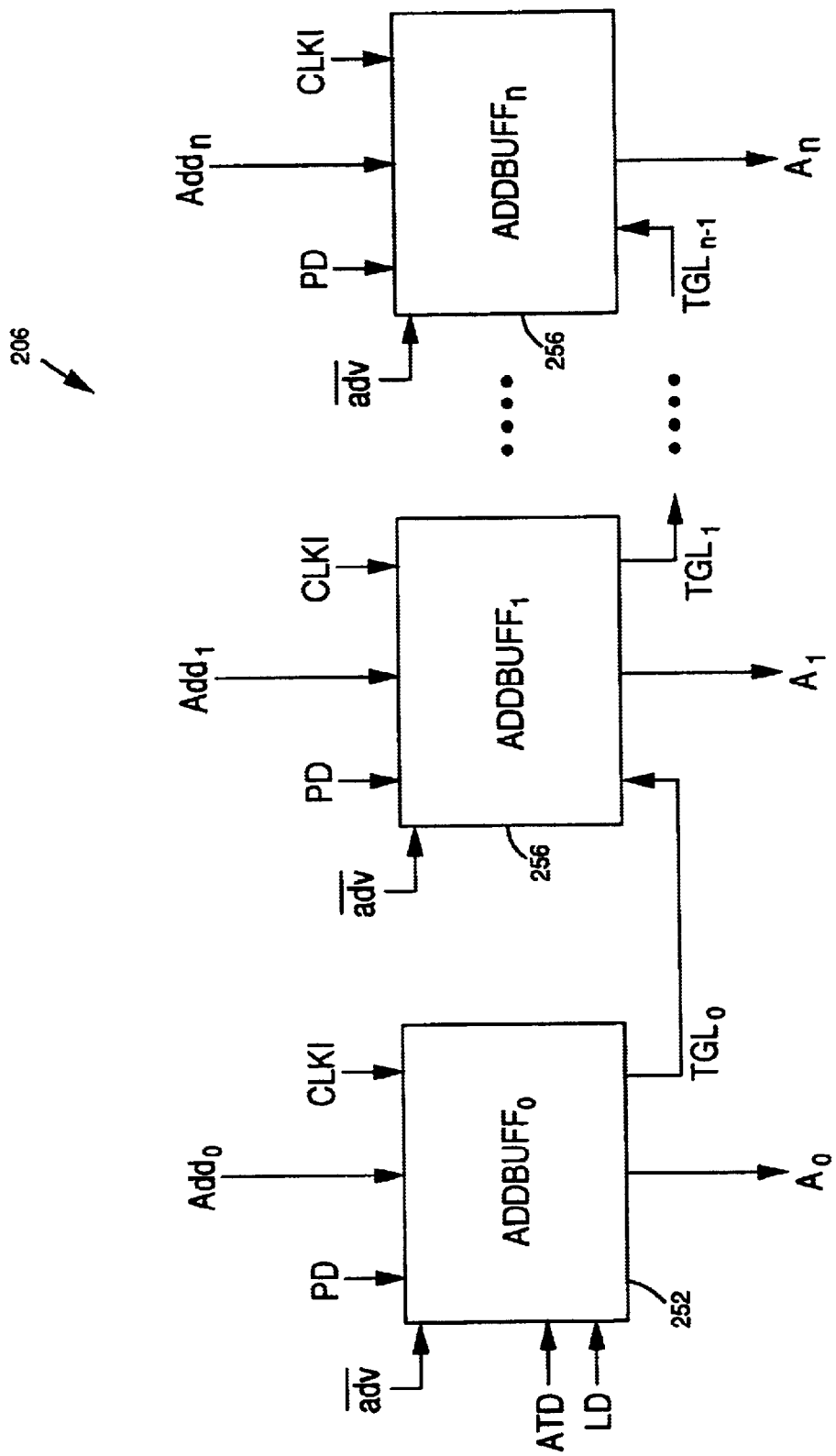
FIG. 7 is a circuit diagram of the address buffer block according to the memory of FIG. 2.

An address valid signal $\overline{ADV}$ is applied at an input, preferably an external input, of the memory 200 and is received at the address valid buffer 206. The $\overline{ADV}$ signal indicates whether or not an initial address signal ADD is presently being applied to the memory 200 and whether or not the initial address signal ADD is valid. The initial address signal ADD is applied at an input, preferably an external input, of the memory 200 and is received at the address buffer block 208. The address buffer block 208 includes a series of address buffers. Preferably, the address buffers are cascaded together in a chain, as shown in FIG. 7 and described in more detail below. Each address buffer of the chain of address buffers is configured to produce and store an address bit. In the memory 200 of FIG. 2, there are n+1 address buffers within the address buffer block 208, each receiving a respective bit $Add_0, Add_1, Add_2, \ldots Add_n$ of the initial address signal ADD and producing and storing a respective bit $A_0, A_1, A_2, A_n$ of a present address signal ADDP. These address bits $A_0, A_1, A_2, \ldots A_n$ form the present address signal ADDP, an n+1 bit address. Preferably, the address bits $A_1, A_2, \ldots A_n$ are received by the decoder 204. The address bit $A_0$ is the least significant bit of the address and is generated and stored by the first address buffer in the address buffer chain within the address buffer block 208. The address bit $A_0$ preferably serves as a control signal and is provided to each data multiplexer of the series of data multiplexers beginning with $M_0$ 232 and ending with $M_M$ 234. Preferably, each data multiplexer selects data words according to the transition of the control signal $A_0$. Preferably, it is not required that the control signal $A_0$ be presented to the decoder 204. That is, it should be understood that, as used herein, the present address signal ADDP refers broadly to the address bits $A_1, A_2, \ldots A_n$, with or without the control signal $A_0$ in conformance with the context within which the present address signal ADDP is described. For example, in FIG. 2, the control signal $A_0$ is provided to the timing control circuit 210 as well as the data multiplexers, 232 . . . 234, but is not provided to the decoder 204. In this instance, the present address signal ADDP is provided to the decoder 204.

The core cell array 202 includes a plurality of core cells, each configured to store data. Preferably, the core cell array is a set of flash memory cells. However, other non-volatile memories can also be used in other embodiments. Preferably, the arrays are organized by words and then by sectors and can either be byte or word addressable. In some applications, each core cell may store a single bit of data; in other applications, each core cell may store two or more bits of data. In a presently preferred embodiment, the core cells of the core cell array 202 are word-addressable, and two data words are accessed simultaneously by the present address signal ADDP at the address buffer block 208. The present address signal ADDP from the address buffer block 208 is decoded by the decoder 204. Preferably, the decoder 204 includes row and column decoding circuitry, such as X and Y decoders. X and Y decoders are well known in the art of semiconductor memories, and in particular, flash memories. Some examples of flash memory decoder implementations are described in U.S. Pat. No. 5,867,430 to Chen et al., and U.S. Pat. No. 5,847,998 to Van Buskirk, et al., incorporated by reference herein.

The decoder 204 couples appropriate columns of the core cell array 202 to the first series of sense amplifiers $S/A_{LO}$ 216 . . . $S/A_{LM}$ 220 and the second series of sense amplifiers $S/A_{HO}$ 218 . . . $S/A_{HM}$ 222. The first series and the second series of sense amplifiers sense the current in selected core cells that form a pair of data words of the core cell array 202 and determine the binary state of the data stored in the selected core cells that form the pair of data words accessed simultaneously by the present address signal ADDP at the address buffer block 208. In general there are M+1 sense amplifiers in each of the first series of sense amplifiers and the second series of sense amplifiers. In a preferred embodiment of the memory 200, there are M+1=16 sense amplifiers in the first series of sense amplifiers to sense a 16 bit data word from the core cell array 202. Similarly, in a preferred embodiment of the memory 200, there are M+1=16 sense amplifiers in the second series of sense amplifiers to sense a 16 bit data word from the core cell array 202.

A pair of data words in the memory 200 at a particular moment in time may be characterized as high and low, respectively. A high data word corresponds to a logic high value of the control signal $A_0$, while a low data word corresponds to a logic low value of the control signal $A_0$. The high data words are sensed by the high sense amplifiers, i.e., the second series of sense amplifiers $S/A_{HO}$ 218 ... $S/A_{HM}$ 222, while the low data words are sensed by the low sense amplifiers, i.e., the first series of sense amplifiers $S/A_{LO}$ 216 ... $S/A_{LM}$ 220. The control signal $A_0$ from the address buffer block 208 is used to select between the high and low data words accessed from the memory 200 at the series of data multiplexers 232 ... 234. An output enable signal $\overline{OE}$ is applied at an input, preferably an external input, of the memory 200 and is received at the series of output buffers beginning with $OUTBUF_0$ 236 and ending with $OUTBUF_M$ 238. The output buffers 236 ... 238 receive the data word (high or low) of core cell data. Preferably, the output buffers 236 ... 238 together produce a multiple-bit data word signal DATA, responsively to the output enable signal $\overline{OE}$, at an output of the memory 200 for use external to the memory 200. Typically, the DATA signal will correspond to the information stored in a series of core memory cells addressable as data words of the memory 200. Preferably, the DATA signal alternates between a high data word and a low data word in accordance with the control signal $A_0$ and the output enable signal $\overline{OE}$. In a preferred embodiment of the memory 200, the DATA signal is 16 bits in length. Other circuitry, not shown in FIG. 2, provides and facilitates for voltage boosting, programming, reading, verifying, erasing, and performing other operations as necessary on the individual core cells of the core cell array 202.

A signal ATDAd is generated by the address valid buffer 206 and is provided to the timing control circuit 210. When the input signal PD is at a logic low and the memory 200 is enabled, the ATDAd signal follows the $\overline{ADV}$ signal. A signal $\overline{adv}$ is generated by the address valid buffer 206 and is provided to the address buffer block 208 and the clock counter circuit 212. A signal STP is generated by the clock counter circuit 212 and is provided to the clock buffer 214. An address transition detection signal ATD is generated by the timing control circuit 210 and is provided to the address buffer block 208 and in particular to the first address buffer in the chain of address buffers, as shown in FIG. 7 and described in more detail below. A signal EQ and a signal LT are both generated by the timing control circuit 210 and are provided to each sense amplifier of the first series of sense amplifiers $S/A_{LO}$ 216 ... $S/A_{LM}$ 220 and the second series of sense amplifiers $S/A_{HO}$ 218 ... $S/A_{HM}$ 222. A signal LD is generated by the timing control circuit 210 and is provided to each latch of the series of latches beginning with $LATCH_{LO}$ 224 and $LATCH_{HO}$ 226 and ending with $LATCH_{LM}$ 228 and $LATCH_{HM}$ 230. A signal CLKT is generated by the timing control circuit 210 and is a timing signal that is provided to the clock buffer 214. A signal CLKI is another timing signal that is generated by the clock buffer 214 and that is provided to the address buffer block 208 and in particular to each address buffer in the chain of address buffers.

Figure 3:
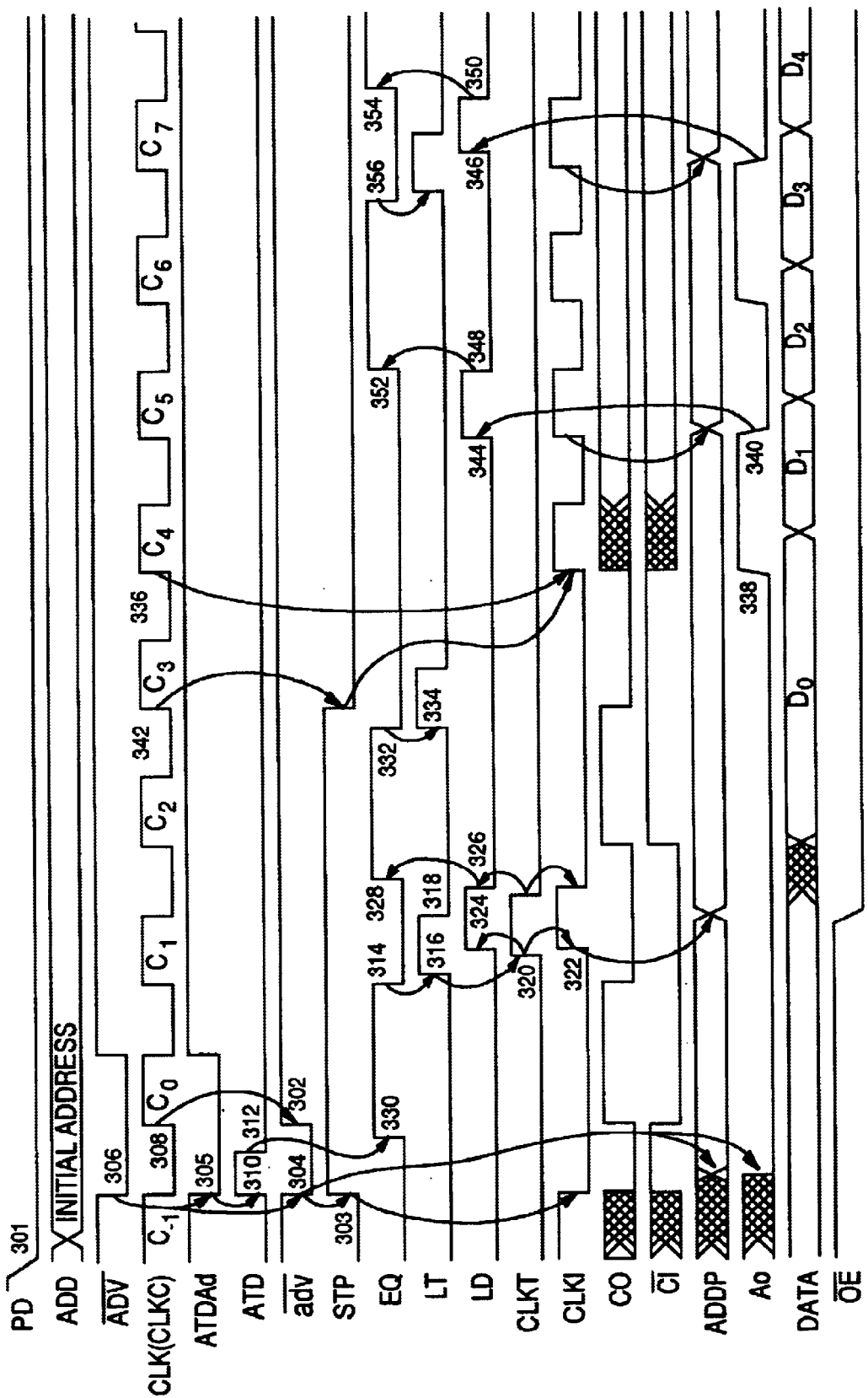
FIG. 3 is a timing diagram illustrating the basic operation of the exemplary burst mode architecture of FIG. 2.

Referring now to FIG. 3, it is a timing diagram illustrating the basic operation of the exemplary burst architecture of FIG. 2. In particular, FIG. 3 illustrates the initial state and the period following the initial state of the memory 200. The cross-hatched areas in FIG. 3 represent the boundaries of don't care areas where the values of the signals are indeterminate and/or not relevant to circuit operation. In FIG. 3, the falling edge 301 of the input signal PD enables the memory 200. As a result, the CLKC signal follows the CLK signal, so the timing graph for both signals is shown as CLK(CLKC). A valid initial address ADD is supplied to the memory 200. The $\overline{ADV}$ signal goes low to indicate that a valid address ADD is present at the address buffer block 208. The falling edge 306 of the $\overline{ADV}$ signal causes the $\overline{adv}$ signal from the address valid buffer 206 to go low and the ATDAd signal from the address valid buffer 206 to go low as well. The falling edge 304 of the $\overline{adv}$ signal loads the bits of the initial address ADD into the address buffer block 208 so that the present address ADDP is equal, at first, to the initial address ADD. The falling edge 304 of the $\overline{adv}$ signal causes the STP signal from the clock counter circuit 212 to go high. With the rising edge 303 of the STP signal, the CLKI signal will stop following the CLK signal and will stay low following the next rising edge 308 of the CLK signal. In addition, the falling edge 304 of the $\overline{adv}$ signal resets the clock counter circuit 212 so that the circuit 212 begins to count the number of clock pulses of the CLKC signal (and thus the CLK signal). The clock pulses of the CLK signal shown in FIG. 1 are labeled $C_{-1}$, $C_0$, $C_1$, $C_2$, $C_3$, $C_4$, $C_5$, $C_6$, and $C_7$ respectively. The rising edge 308 of the first clock pulse $C_0$ causes the $\overline{adv}$ signal to go high. The rising edge 302 of the $\overline{adv}$ signal latches the multiple-bit address ADD in the address buffer block 208. The falling edge 305 of the ATDAd signal triggers an ATD signal pulse from the timing control circuit 210. The rising edge 310 of the ATD signal sets the address buffer block 208 so that the present address signal ADDP can be increment without changing the control signal $A_0$. Although the control signal $A_0$ is initially low following the falling edge 304 of the $\overline{adv}$ signal for the example shown in the timing diagram of FIG. 3, in other examples the control $A_0$ can of course be high following the falling edge 304.

The falling edge 312 of the ATD signal with the LD signal low triggers a signal pulse and rising edge 330 of the EQ signal and thus initiates a first or initial access of the core cell array 202 of FIG. 2. Preferably, the core cells of the core cell array 202 are word addressable. The core cell locations storing the data words for the initial and subsequent accesses are selected by the bits of the present address signal ADDP. For the initial access the present address signal ADDP takes on the value of the initial address signal ADD. The initial address signal ADD as stored and produced by the address buffer block 208 will access two data words of memory, for example, simultaneously. In a presently preferred embodiment, each data word is 16 bits in length. Subsequent addresses ADDP stored and produced by the address buffer block 208 will access two data words of memory, for example, simultaneously. In a presently preferred embodiment, a subsequent access is executed with every two pulses of the clock or timing signal CLK (or CLKC if applicable). To initiate additional or subsequent accesses, a subsequent address ADDP needs to be generated by the address buffer block 208. The subsequent address ADDP is generated by incrementing the initial value of the present address signal ADDP, that is, the initial address signal ADD. Therefore, incrementing preferably occurs between accesses. In a preferred embodiment, an access occurs within a signal pulse of the EQ signal.

The rising edge 330 of the EQ signal from the timing control circuit 210 turns on the first series of sense amplifiers $S/A_{LO}$ 216 ... $S/A_{LM}$ 220 and the second series of sense amplifiers $S/A_{HO}$ 218 ... $S/A_{HM}$ 222 so that the first series and the second series of sense amplifiers begin to sense the data, preferably in the form of data words, from the selected core cell locations for the initial access. In a preferred embodiment, there are 16 low sense amplifiers $S/A_{L0}$ ... $S/A_{L15}$ that together receive a low data word, and 16 high sense amplifiers $S/A_{H0}$ ... $S/A_{H15}$ that together receive a high data word, for a total of 32 sense amplifiers. The falling edge 314 of the EQ signal triggers the LT signal from the timing control circuit 210. The rising edge 316 of the LT signal moves the data words from the initial access, as accessed or read from the core cells by the first series and the second series of sense amplifiers, into latch stages (not shown) located within the first series of sense amplifiers $S/A_{LO}$ 216 ... $S/A_{LM}$ 220 and the second series of sense amplifiers $S/A_{HO}$ 218 ... $S/A_{HM}$ 222. For this reason, the first series and the second series of sense amplifiers are preferably designed to complete the reading or accessing of the core cell data so that the data are ready prior to the rising edge 316 of the LT signal. The falling edge 318 of the LT signal latches the data in the internal latch stages (not shown) located within the first series of sense amplifiers $S/A_{LO}$ 216 ... $S/A_{LM}$ 220 and the second series of sense amplifiers $S/A_{HO}$ 218 ... $S/A_{HM}$ 222. The rising edge 316 of the first LT pulse triggers the CLKT timing signal from the timing control circuit 210. The rising edge 320 of the CLKT pulse generates a CLKI signal pulse from the clock buffer 214 and an LD signal pulse from the timing control circuit 210. The rising edge 322 of the CLKI internal clock signal increments the internal address bits $A_1, A_2, \ldots A_n$ of the n+1 bit present address signal ADDP produced and stored by the address buffer block 208. In this way, the address buffer block 208 generates subsequent addresses ADDP by incrementing the present address signal ADDP using the CLKI signal so that a new access can begin. Preferably, at this juncture, the CLKI signal does not vary the control signal $A_0$ generated and stored by the first address buffer in the address buffer chain within the address buffer block 208. Preferably, the control signal $A_0$ remains constant during the initial state. Meanwhile, the LD signal is provided to each latch of the series of latches beginning with LATCH$_{LO}$ 224 and LATCH$_{HO}$ 226 and ending with LATCH$_{LM}$ 228 and LATCH$_{HM}$ 230. In a preferred embodiment, there are 16 latches LATCH$_{L0}$ ... LATCH$_{L15}$ that together receive and store a low data word, and 16 latches LATCH$_{H0}$ ... LATCH$_{L15}$ that together receive and store a high data word, for a total of 32 latches. The rising edge 324 of the LD signal loads the data words from the initial access from the internal latch stages in the first series of sense amplifiers $S/A_{LO}$ 216 ... $S/A_{LM}$ 220 and the second series of sense amplifiers $S/A_{HO}$ 218 ... $S/A_{HM}$ 222 to the latches 224, 226, ... 228, 230. The bits of the high and the low data words are moved into the respective high and low latches.

Preferably, the falling edge 326 of the LD signal initiates the rising edge 328 of the EQ signal, so that a second access can begin. That is, the present address signal ADDP, initially equivalent to the initial address signal ADD, has been incremented in response to the rising edge 322 of the CLKI signal so that a new present address signal ADDP that corresponds to, for example, two new data words is available for the second access. The rising edge 328 of the second pulse of the EQ signal turns on the first series of sense amplifiers $S/A_{LO}$ 216 ... $S/A_{LM}$ 220 and the second series of sense amplifiers $S/A_{HO}$ 218 ... $S/A_{HM}$ 222 so that the first series and the second series of sense amplifiers begin to sense the data, preferably in the form of data words, from the selected core cell locations for the second access. When the falling edge 332 of the EQ signal generates the rising edge 334 of the LT signal, then the data corresponding to the second access are ready, and the burst operation can begin.

As described above, the falling edge 304 of the $\overline{adv}$ signal resets the clock counter circuit 212 so that the circuit 212 begins to count the number of clock pulses of the CLKC signal (and thus the CLK signal). After counting a number of pulses of the CLK (four pulses in FIG. 3), the CLK signal accomplishes the task of incrementing the present address signal ADDP by triggering pulses of the CLKI signal. Every other rising edge of the CLKI signal, which is equivalent with the CLK/CLKC signal beginning with the rising edge 336 of clock pulse $C_4$, will increment and update the present address signal ADDP, while producing the DATA signal with every pulse of the CLK/CLKC signal. Of course, the number of clock pulses counted by the clock counter circuit 212 can be more or less than four pulses, depending on the implementation. Preferably, the number of pulses will be preset in the memory 200. Increasing or decreasing the number of pulses of the CLK signal affords design flexibility in allowing for access times.

The control signal $A_0$ is used to select between the high and low data words accessed from the core cell array 202. Preferably, every time that the control signal $A_0$ changes from high to low, for example at the exemplary falling edges 338, 340 shown in FIG. 3, a pulse of the LD signal is generated. An exemplary rising edge 344, 346 of the LD signal pulse loads the low and high data words from the present access from the internal latch stages (not shown) in the first series of sense amplifiers $S/A_{LO}$ 216 ... $S/A_{LM}$ 220 and the second series of sense amplifiers $S/A_{HO}$ 218 ... $S/A_{HM}$ 222 to the latches 224, 226, ... 228, 230. Preferably, an exemplary falling edge 348, 350 of the LD signal pulse initiates an exemplary rising edge 352, 354 of the EQ signal, so that a new access can begin. When the new access is complete, an exemplary falling edge 356 of the EQ signal triggers a pulse of the LT signal to move the low and high data words from the new access into the internal latch stages in the first series of sense amplifiers and the second series of sense amplifiers.

For successive pulses of the CLKI signal, which follows the CLK signal after the initial state or period of time, a subsequent present address signal ADDP is generated with every two pulses of the CLK/CLKC/CLKI signal, two data words are accessed for every subsequent present address signal ADDP with every two pulses of the CLK/CLKC/CLKI signal, two data words are stored with every two pulses of the CLK/CLKC/CLKI signal, and one data word, i.e., the DATA signal, is produced at the output of the memory with every pulse of the CLK/CLKC/CLKI signal.

If the given initial address ADD is an even address, that is, with the least significant bit Add$_0$ of the initial address ADD low, the burst operation can start while the second access is still going. If the initial address ADD is an odd address, then the initial value of the control signal $A_0$ from the address buffer block 208 is high, and the second access preferably completes prior to the start of the burst operation.

Figure 4:
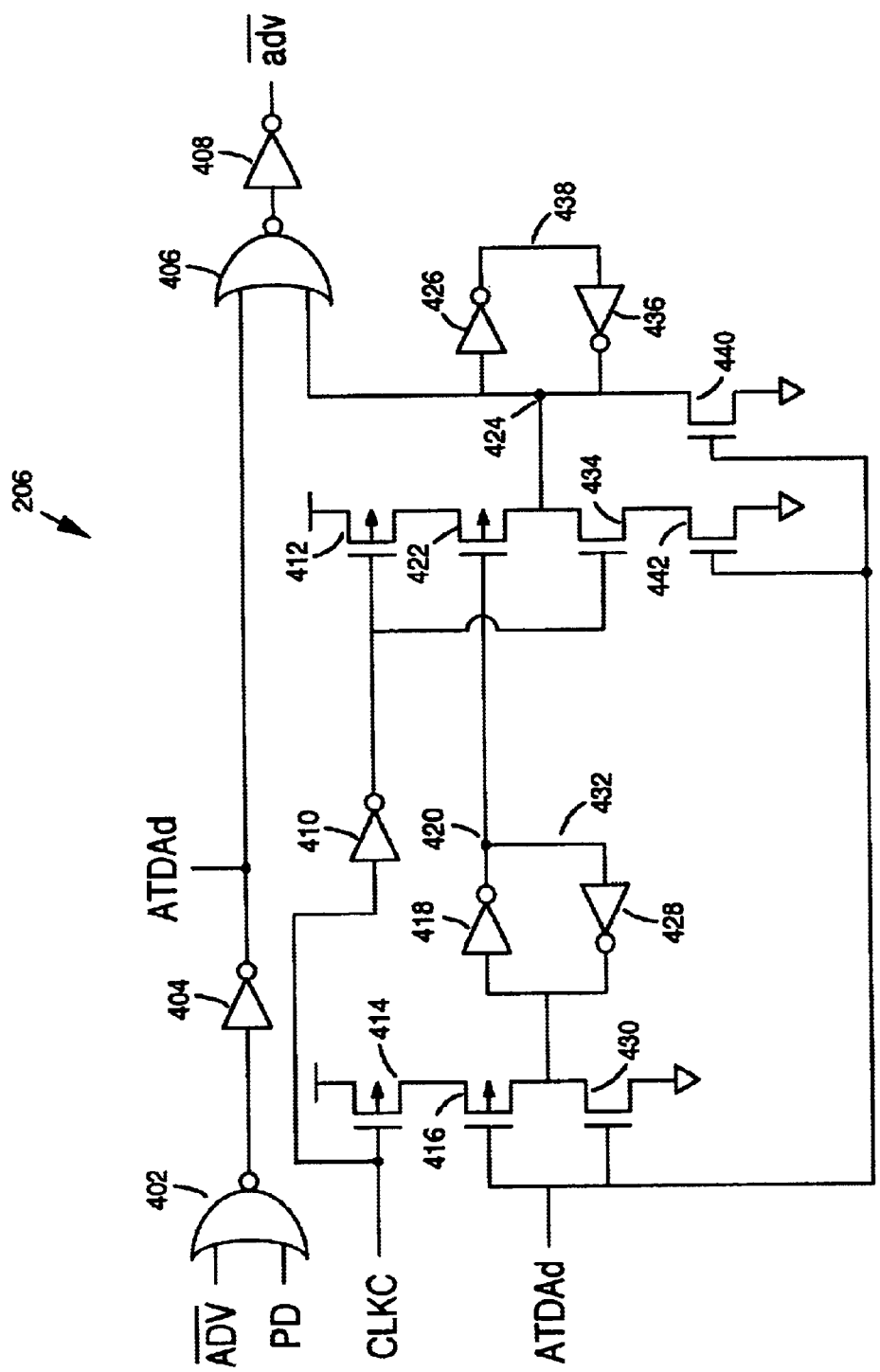
FIG. 4 is a circuit diagram of an exemplary address valid buffer according to the memory of FIG. 2.

Referring now to FIG. 4, it is a circuit diagram of an exemplary address valid buffer 206 according to the memory 200 of FIG. 2. The address valid buffer 206 includes a pair of NOR gates 402, 406, a first latch 432, a second latch 438, n-channel transistors 430, 434, 442, 440 and p-channel transistors 414, 416, 412, 422 utilized as switching logic, and inverters 404, 408, 410. Preferably, the first latch 432 includes a pair of inverters 418, 428. Preferably, the second latch 438 includes a pair of inverters 426, 436.

The address valid signal $\overline{ADV}$ is externally applied to the memory 200 and is received at the address valid buffer 206. The $\overline{ADV}$ signal indicates whether or not a valid initial address signal ADD is presently being applied to the memory 200. The $\overline{adv}$ signal is generated by the address valid buffer 206 and is provided to the address buffer block 208 and the clock counter circuit 212. The ATDAd signal is generated by the address valid buffer 206 and is provided to the timing control circuit 210. The CLKC signal is generated by the clock buffer 214 and is provided to the address valid buffer 206.

When the input signal PD is at a logic high, the memory 200 is in power down mode, the ATDAd signal is high, and the $\overline{adv}$ signal is high, i.e., in an off state. When the input signal PD is at a logic low and the memory 200 is enabled, the ATDAd signal follows the $\overline{ADV}$ signal, and the CLKC signal follows the CLK signal. When the $\overline{ADV}$ signal is high, the ATDAd signal is high and a first node 420 is high and a second node 424 is low. Then, if the $\overline{ADV}$ signal goes low and the ATDAd signal goes high with the second node 424 low, then the $\overline{adv}$ signal goes low. With the $\overline{ADV}$ signal and the $\overline{adv}$ signal both low, then the second node 424 goes high with the rising edge of the CLKC signal, and the $\overline{adv}$ signal goes high and returns to an off state.

Figure 5:
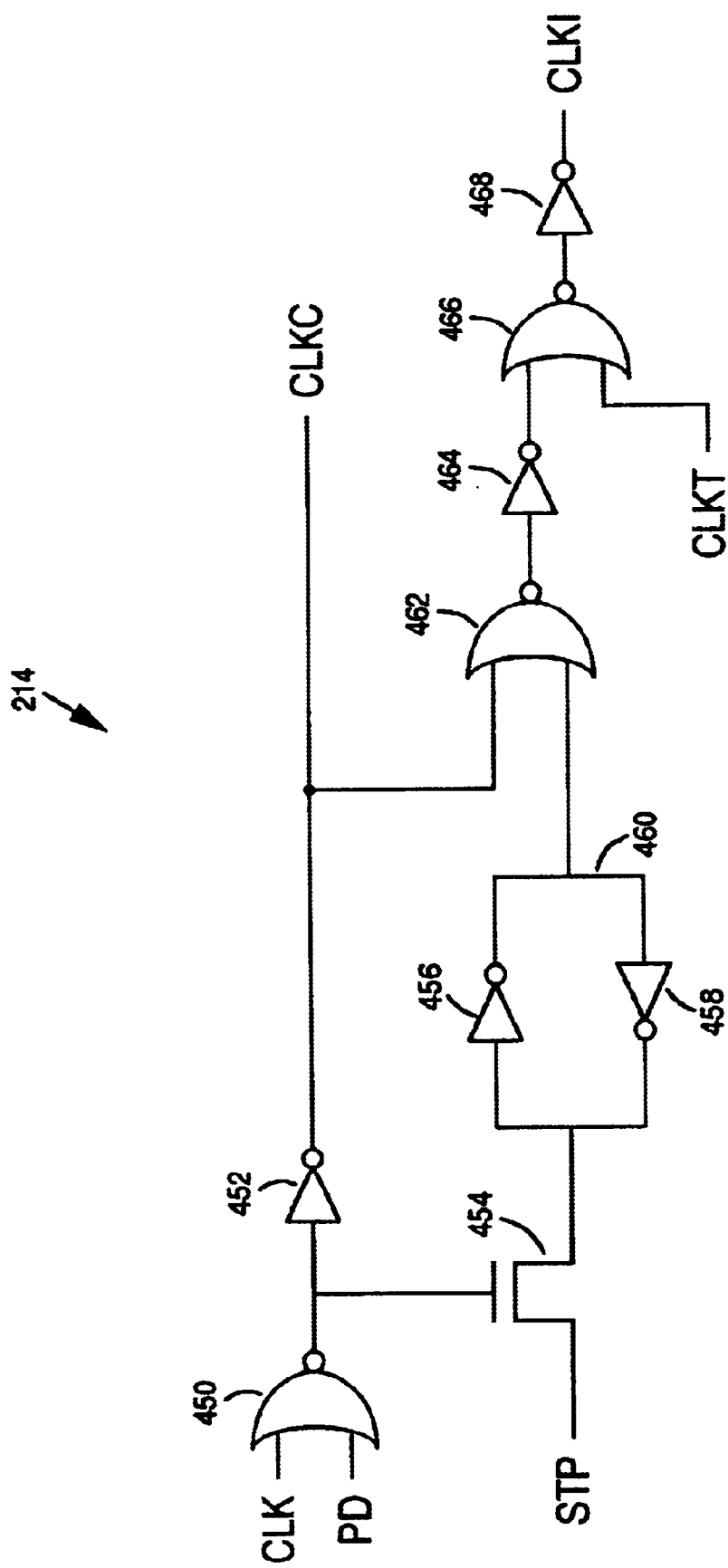
FIG. 5 is a circuit diagram of an exemplary clock buffer according to the memory of FIG. 2.

Referring now to FIG. 5, it is a circuit diagram of an exemplary clock buffer 214 according to the memory 200 of FIG. 2. The clock buffer 214 includes a pair of NOR gates 450, 466, an AND gate 462, a latch 460, an n-channel transistor 454 utilized as a switch, and inverters 452, 464, 468. Preferably, the latch 460 includes a pair of inverters 456, 458.

The CLK signal is applied at an input, preferably an external input, of the memory 200 and is received at the clock buffer 214 of FIG. 5. The CLKC signal is a timing signal that is generated by the clock buffer 214 and that is provided to the clock counter circuit 212 and the address valid buffer 206 of FIG. 4. The STP signal is generated by the clock counter circuit 212 and is provided to the clock buffer 214. The CLKT signal is generated by the timing control circuit 210 and is a timing signal that is provided to the clock buffer 214. The CLKI signal is another timing signal that is generated by the clock buffer 214 and that is provided to the address buffer block 208 and in particular to each address buffer in the chain of address buffers.

When the input signal PD is at a logic high, the memory 200 is in power down mode, and the CLKC signal is high, or in an off state. When the input signal PD is at a logic low and the memory 200 is enabled, the CLKC signal follows the CLK signal. A rising edge of the CLKT signal drives the CLKI signal high. With the STP signal high following a falling edge of the CLK signal, an output of the latch 460 and thus the inverter 464 will be low, and a falling edge of the CLKT signal drives the CLKI signal low. When the STP signal goes high, the CLKI signal will stop following the CLK signal and will stay low following the next rising edge of the CLK signal. When the STP signal goes low, the CLKI signal follows the CLK signal following the next rising edge of the CLK signal.

Figure 6:
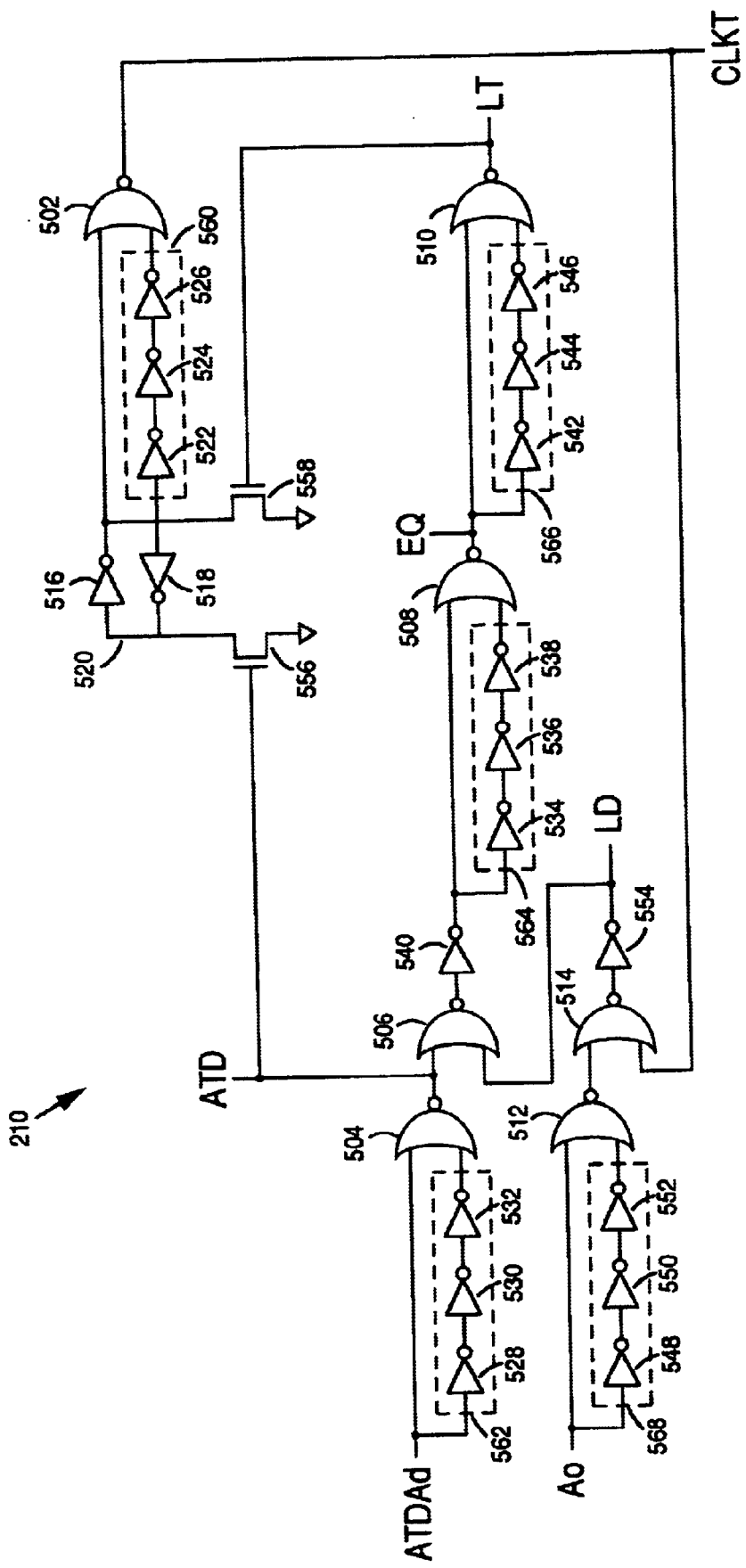
FIG. 6 is a circuit diagram of an exemplary timing control circuit according to the memory of FIG. 2.

Referring now to FIG. 6, it is a circuit diagram of an exemplary timing control circuit 210 according to the memory 200 of FIG. 2. The timing control circuit 210 includes NOR gates 502, 504, 506, 508, 510, 512, 514, a latch 520, a first inversion delay stage 560, a second inversion delay stage 562, a third inversion delay stage 564, a fourth inversion delay stage 566, a fifth inversion delay stage 568, inverters 540, 554, and n-channel transistors 556, 558 utilized as switching logic. Preferably, the latch 520 includes a pair of inverters 516, 518. Preferably, the first inversion delay stage 560 includes three inverters 522, 524, 526 in series. Preferably, the second inversion delay stage 562 includes three inverters 528, 530, 532 in series. Preferably, the third inversion delay stage 564 includes three inverters 534, 536, 538 in series. Preferably, the fourth inversion delay stage 566 includes three inverters 542, 544, 546 in series. Preferably, the fifth inversion delay stage 568 includes three inverters 548, 550, 552 in series.

Considering the generation of the ATD signal from the NOR gate 504 of FIG. 6, when the ATDAd signal goes from high to low, the output of the second inversion delay stage 562 will be low for some duration of time and an ATD signal pulse will appear from the NOR gate 502 for that period of time. Otherwise, the ATD signal will be low. That is, a falling edge of the ATDAd signal triggers a signal pulse of the ATD signal.

With respect to the generation of the EQ signal from the NOR gate 508 of FIG. 6, if the LD signal goes from high to low and the ATD signal is not high, or if the ATD signal goes from high to low and the LD signal is not high, then the output of the NOR gate 506 goes from low to high and the output of the inverter 540 goes from high to low. In this case, the output of the third inversion delay stage 564 will be low for some duration of time and an EQ signal pulse will appear from the NOR gate 502 for that duration of time. Otherwise, the EQ signal will be low. That is, a falling edge of the LD signal with the ATD signal low triggers a signal pulse of the EQ signal, and a falling edge of the ATD signal with the LD signal low triggers a signal pulse of the EQ signal.

Considering the generation of the LT signal from the NOR gate 510 of FIG. 6, when the EQ signal goes from high to low, the output of the fourth inversion delay stage 566 will be low for some duration of time and an LT signal pulse will appear from the NOR gate 510 for that duration of time. Otherwise, the LT signal will be low. That is, a falling edge of the EQ signal triggers a signal pulse of the LT signal.

With respect to the generation of the CLKT signal from the NOR gate 502 of FIG. 6, the ATD signal at the gate of the n-channel transistor 556 switches an input of the latch 520 to ground. The LT signal at the gate of the n-channel transistor 558 switches an output of the latch 520 to ground. When the ATD signal is pulsed, the output of the latch 520 will be driven high, and the CLKT signal will be forced low. Very shortly thereafter, the output of the first inversion delay stage 560 will be low. The ATD signal pulse resets the latch 520 so that the first pulse of the LT signal to follow will switch the output of the latch 520 to ground. With the output of the first inversion delay stage 560 low for some duration of time, a CLKT signal pulse will appear from the NOR gate 502 for that duration of time. A subsequent LT signal pulse will not trigger a CLKT signal pulse until an ATD signal pulse resets the latch 520 again.

Considering the generation of the LD signal from the inverter 554 of FIG. 6, with the CLKT signal low and the control signal $A_0$ high, the output of the NOR gate 514 is high, and the LD signal at the output of the inverter 554 is low. A pulse of the CLKT signal triggers a signal pulse of the LD signal. When the control signal $A_0$ goes from high to low, the output of the fifth inversion delay stage 568 will be low for some duration of time and a signal pulse will appear from the NOR gate 512 for that period of time. This signal pulse in turn triggers a signal pulse of the LD signal at the output of the inverter 554. That is, a falling edge of the control signal $A_0$ or a signal pulse of the CLKT signal triggers a signal pulse of the LD signal.

Referring now to FIG. 7, it is a circuit diagram of the address buffer block 208 according to the memory 200 of FIG. 2. The address buffer block 208 includes a series of address buffers from $ADDBUFF_0$ 252, $ADDBUFF_1$ 256 to $ADDBUFF_n$ 256. Preferably, the address buffers 252, 256, . . . 256 are cascaded together in a chain as shown in FIG. 7. Each address buffer of the chain of address buffers is configured to produce and store an address bit. In the memory 200 of FIG. 2, there are n+1 address buffers within the address buffer block 208, each receiving a respective bit $Add_0$, $Add_1$, $Add_2$, . . . $Add_n$ of the initial address signal ADD and producing and storing a respective bit $A_0$, $A_1$, $A_2$, . . . $A_n$ of the present address signal ADDP. These address bits $A_0$, $A_1$, $A_2$, . . . $A_n$ form the present address signal ADDP, an n+1 bit address. Preferably, the address bits $A_1, A_2, \ldots A_n$ are received by the decoder 204. The control signal $A_0$ is generated and stored by the first address buffer $ADDBUFF_0$ 252 in the address buffer chain within the address buffer block 208.

Figure 8:
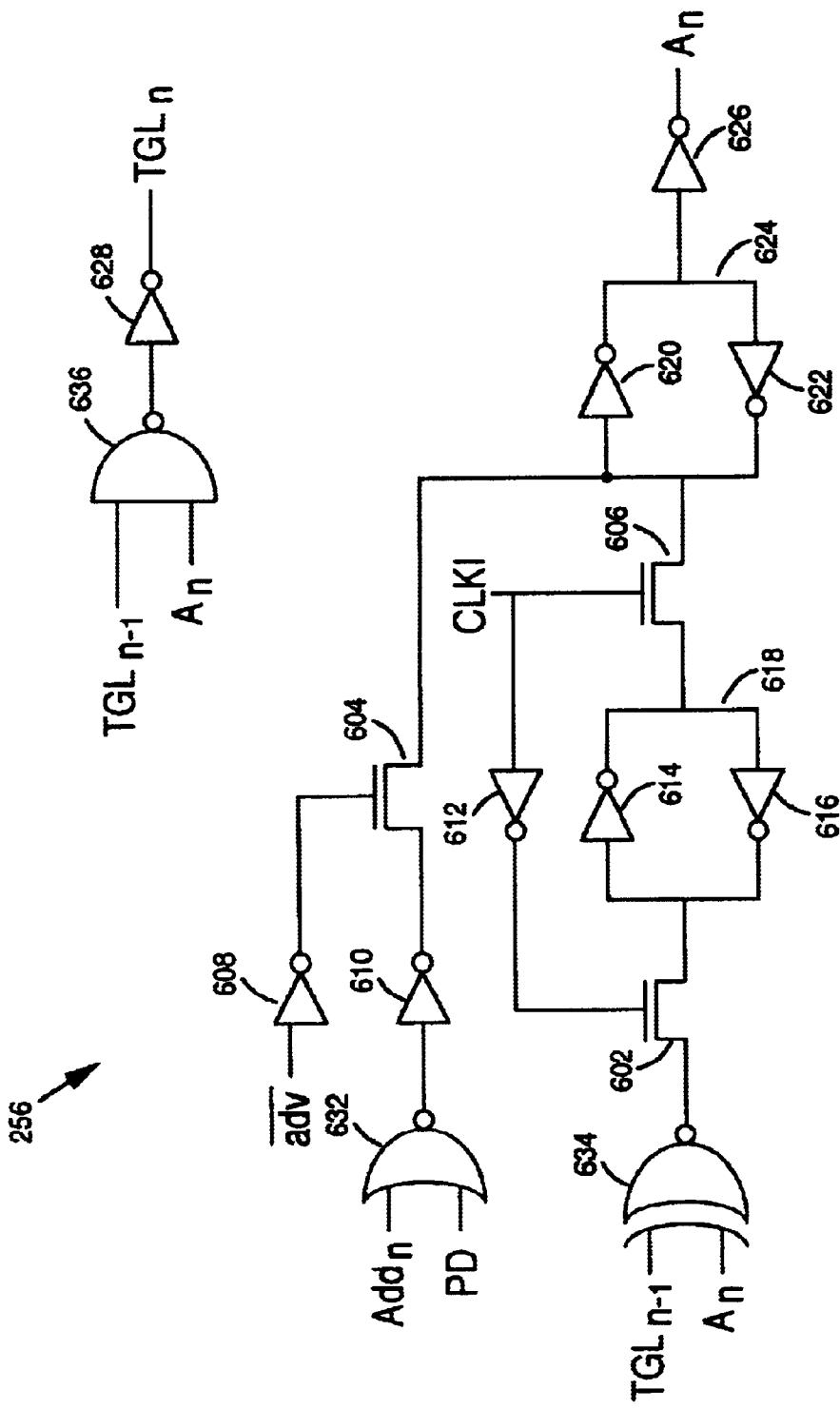
FIG. 8 is a circuit diagram of an exemplary address buffer stage according to the address buffer block of FIG. 7.

Referring now to FIG. 8, it is a circuit diagram of an exemplary address buffer $ADDBUFF_n$ 256 according to the address buffer block 208 of FIG. 7. The address buffer $ADDBUFF_n$ 256 includes a NOR gate 632, an AND gate 636, an exclusive-NOR or equivalence gate 634, a first latch 618, a second latch 624, inverters 608, 610, 612, 626, 628 and n-channel transistors 602, 604, 606 utilized as switches. Preferably, the first latch 618 includes a pair of inverters 614, 616. Preferably, the second latch 624 includes a pair of inverters 620, 622.

Figure 9:
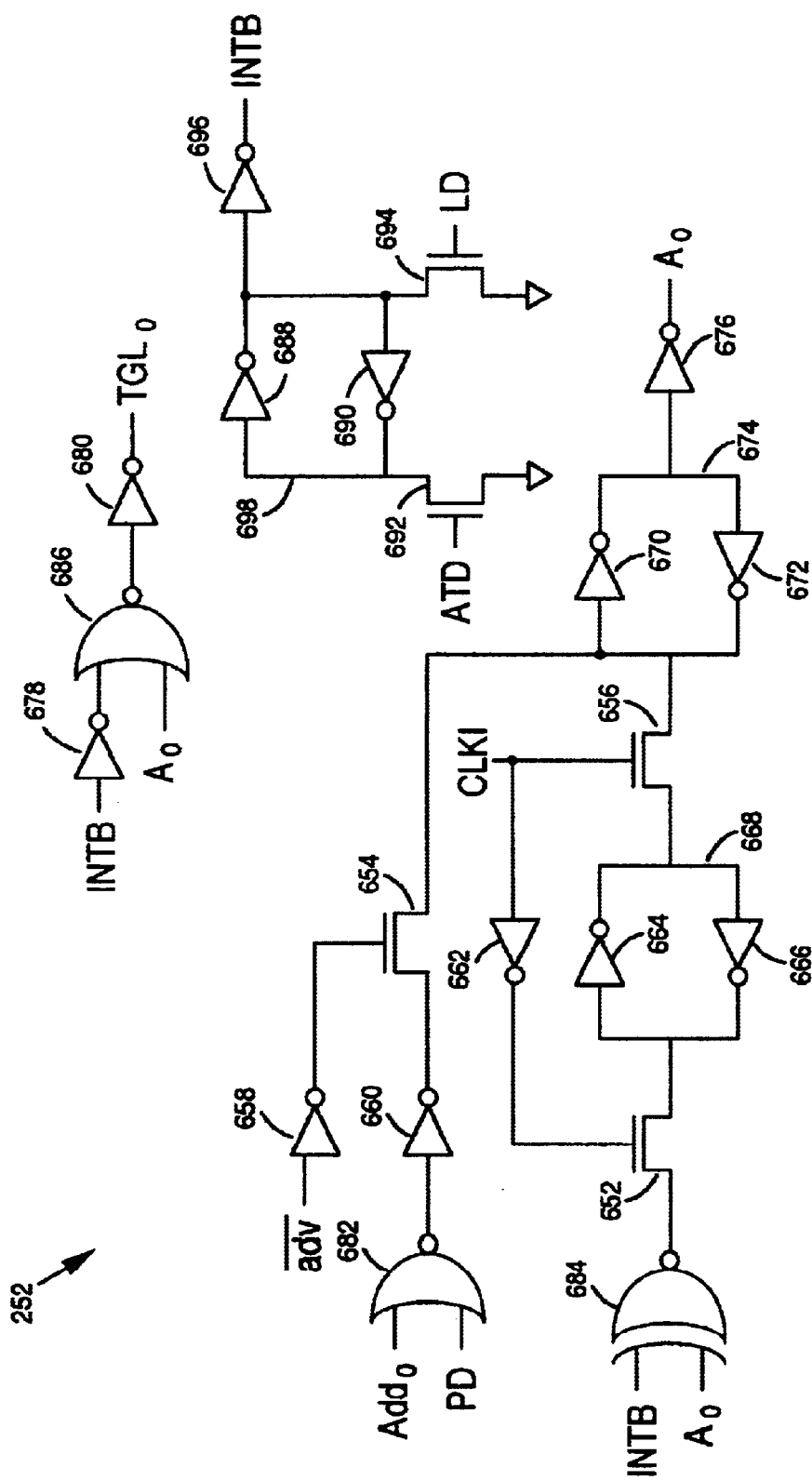
FIG. 9 is a circuit diagram of an exemplary address buffer stage uniquely designed for the least significant bit of the address according to the address buffer block of FIG. 7.

The exemplary address buffer $ADDBUFF_n$ 256 is used to store and generate an address bit $A_n$ of the present address signal ADDP. A series of these address buffers 256 are cascaded together and are used to store and generate all of the address bits except the control signal $A_0$, the least significant bit of the present address signal ADDP. The address buffer $ADDBUFF_0$ 252 used to generate the control signal $A_0$ is illustrated in FIG. 9. Referring to FIG. 8, when the $\overline{adv}$ signal goes low, the address bit $A_n$ of the present address signal ADDP is controlled by the address bit $Add_n$ of the initial address signal ADD. After the $\overline{adv}$ signal goes high, the address bit $A_n$ alternates in value according to the CLKI signal. A signal $TGL_{n-1}$ is the output toggle signal from the previous address buffer in the cascade, i.e., the buffer that generates and stores the address bit $A_{n-1}$. If the signal $TGL_{n-1}$ is high, then the rising edge of the CLKI signal changes the address bit $A_n$ of the present address signal ADDP from low to high or from high to low. If the signal $TGL_{n-1}$ is low, then the signal $TGL_n$ is low. If all the address buffer outputs $(A_{n-1}, A_{n-2}, \ldots A_0)$ prior to the address buffer $ADDBUFF_n$ 256 that generates $A_n$ are high, then the signal $TGLn_{n-1}$ goes high. Each present address signal ADDP preferably corresponds to two data words, and two data words are accessed with every two pulses of the CLK signal. Therefore, the buffers 256 are designed to, following the initial period of time ending with the rising edge of $C_4$ of FIG. 3, increment the bits $A_1, A_2, \ldots A_n$ of the present address signal ADDP once for every two pulses of the CLK signal. The present address signal ADDP is incremented with every other rising edge of the CLKI signal, which coincides with the falling edge of the control signal $A_0$.

Referring now to FIG. 9, it is a circuit diagram of an exemplary address buffer $ADDBUFF_0$ 252 uniquely designed for the least significant bit of the address according to the address buffer block 208 of FIG. 7. The address buffer $ADDBUFF_0$ 256 includes NOR gates 682, 686, an exclusive-NOR or equivalence gate 684, a first latch 668, a second latch 674, a third latch 698, inverters 658, 660, 662, 676, 678, 680, 696, and n-channel transistors 652, 654, 656, 692, 694 utilized as switches or as switching logic. Preferably, the first latch 668 includes a pair of inverters 664, 666. Preferably, the second latch 674 includes a pair of inverters 670, 672. Preferably, the third latch 698 includes a pair of inverters 688, 690.

The exemplary address buffer $ADDBUFF_0$ 252 is used to store and generate the control signal $A_0$, the least significant bit of the present address signal ADDP. A rising edge of the ATD signal switches the input of the third latch 698 to ground by turning on the n-channel transistor 692. A signal INTB, at the output of the inverter 696 will thus be low and a $TGL_0$ signal will be high prior to the first pulse of the LD signal. In this condition, even though a signal pulse of the CLKI signal, which is triggered by the rising edge of the signal CLKT, enters the address buffer $ADDBUFF_0$ 252, the control signal $A_0$ is not toggled while the $TGL_0$ signal stays high so that the present address signal ADDP can be incremented without changing the control signal $A_0$. The first pulse of the LD signal switches the output of the third latch 698 to ground by turning on the n-channel transistor 694. The INTB signal will go high and the control signal $A_0$ will control the $TGL_0$ signal.

Figure 10:
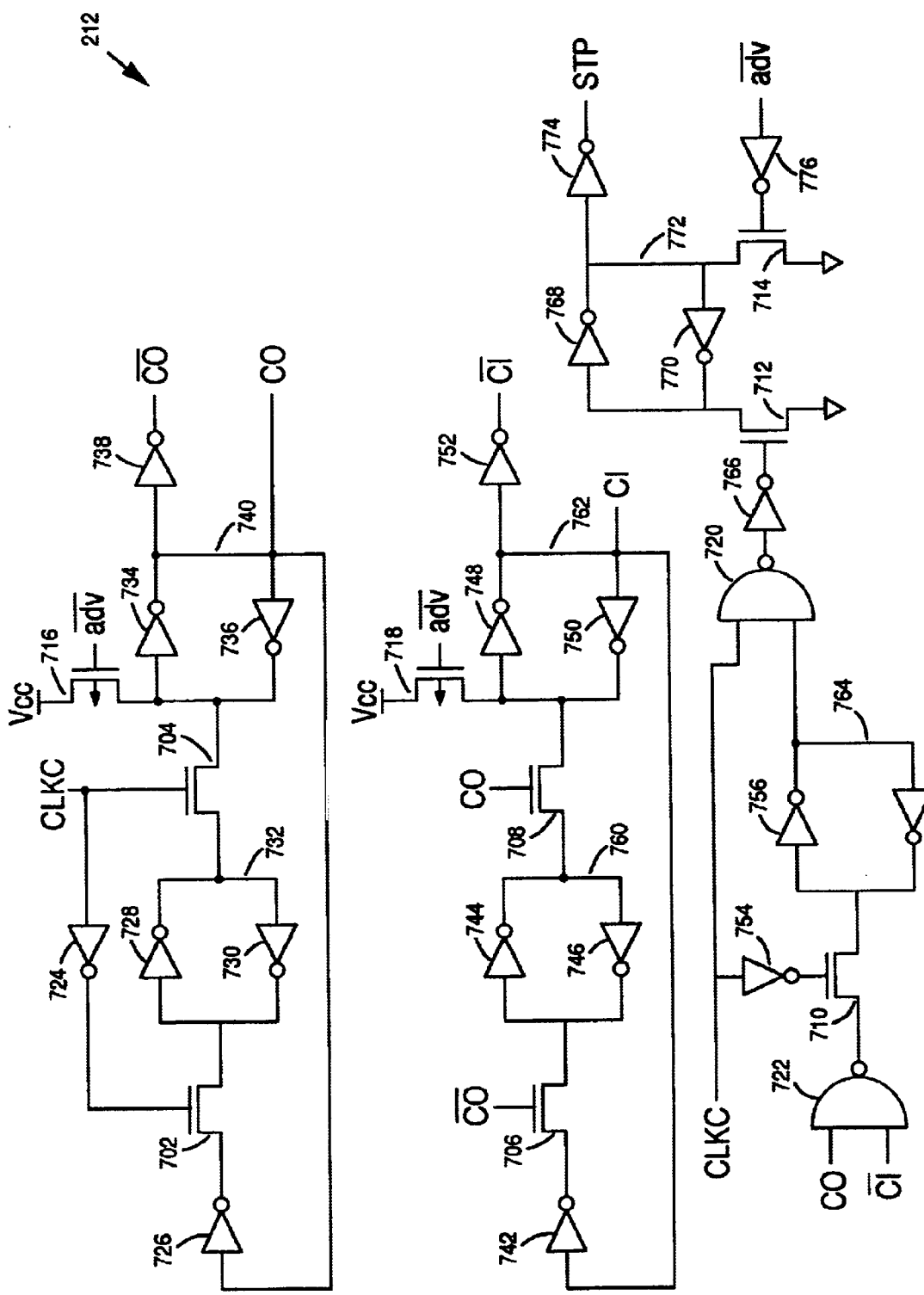
FIG. 10 is a circuit diagram of an exemplary clock counter circuit according to the memory of FIG. 2.

Referring now to FIG. 10, it is a circuit diagram of an exemplary clock counter circuit 212 according to the memory 200 of FIG. 2. The clock counter circuit 212 includes AND gates 720, 722, a first latch 732, a second latch 740, a third latch 760, a fourth latch 762, a fifth latch 764, a sixth latch 772, p-channel transistors 716, 718 and n-channel transistors 702, 704, 706, 708, 710, 712, 714 utilized as switches or as switching logic, and inverters 724, 726, 738, 742, 752, 754, 766, 774, 776. Preferably, the first latch 732 includes a pair of inverters 728, 730. Preferably, the second latch 740 includes a pair of inverters 734, 736. Preferably, the third latch 760 includes a pair of inverters 744, 746. Preferably, the fourth latch 762 includes a pair of inverters 748, 750. Preferably, the fifth latch 764 includes a pair of inverters 756, 758. Preferably, the sixth latch 772 includes a pair of inverters 768, 770.

The CLKC signal is generated by the clock buffer 214 and is provided to the clock counter circuit 212 and the address valid buffer 206. The $\overline{adv}$ signal is generated by the address valid buffer 206 and is provided to the clock counter circuit 212 and the address buffer block 208. A signal STP is generated by the clock counter circuit 212 and is provided to the clock buffer 214.

The clock counter circuit 212 measures an initial period of time by counting an initial number of pulses of the CLKC timing signal. The exemplary clock counter circuit 212 of FIG. 10 measures the initial period of time by counting four initial pulses of the CLKC signal. The period of time between the falling edge of the $\overline{adv}$ signal, or the address valid signal $\overline{ADV}$, and the rising edge of clock pulse $C_4$ of the CLKC signal is called the initial state. During the initial state, the memory has to be ready for burst operation. The initial state includes a certain number N, here N=4 of clock pulses. Of course, other clock counter circuits may be employed, and the clock counter circuit 212 is not limited to counting four clock pulses. The falling edge 304 of the $\overline{adv}$ signal resets the clock counter circuit 212 so that the circuit 212 begins to count the number of pulses of the CLKC signal (and thus the CLK signal). The falling edge 304 of the $\overline{adv}$ signal turns on the n-channel transistor 714 and the p-channel transistors 716, 718. The output of the sixth latch 772 is pulled to ground, and the STP signal goes high. A pair of signals C0 and C1 are pulled low at the respective outputs of the second and fourth latches 740, 762. The signal C0 and the complement $\overline{C1}$ of the C1 signal are illustrated in the timing diagram of FIG. 3. Prior to the rising edge 308 of the first clock pulse $C_0$, as shown in FIG. 3, the respective outputs of the first and third latches 732, 760 are low. The rising edge 308 of the first clock pulse $C_0$ causes the $\overline{adv}$ signal to go high, turning off the transistors 716, 718, and 714. The operation of the clock counter circuit 212 will be apparent to those skilled in the art. In addition, the signals CLK(CLKC), $\overline{adv}$, STP, C0, and $\overline{C1}$ are illustrated in the timing diagram of FIG. 3.

As shown in FIG. 3, the operation of the clock counter circuit 212 of FIG. 10 results in the STP signal of FIG. 10 going low at a rising edge 342 of the clock pulse $C_3$ of the CLKC signal, so that the CLKI signal from the clock buffer 214 begins to run, following the CLKC signal from the rising edge 336 of the clock pulse $C_4$ of the CLKC signal, i.e. the fifth pulse of the CLKC signal after the rising edge of the $\overline{adv}$ signal. The STP signal is latched in a low state and will remain low until a falling edge of the $\overline{adv}$ signal resets the clock counter circuit.

Figure 11:
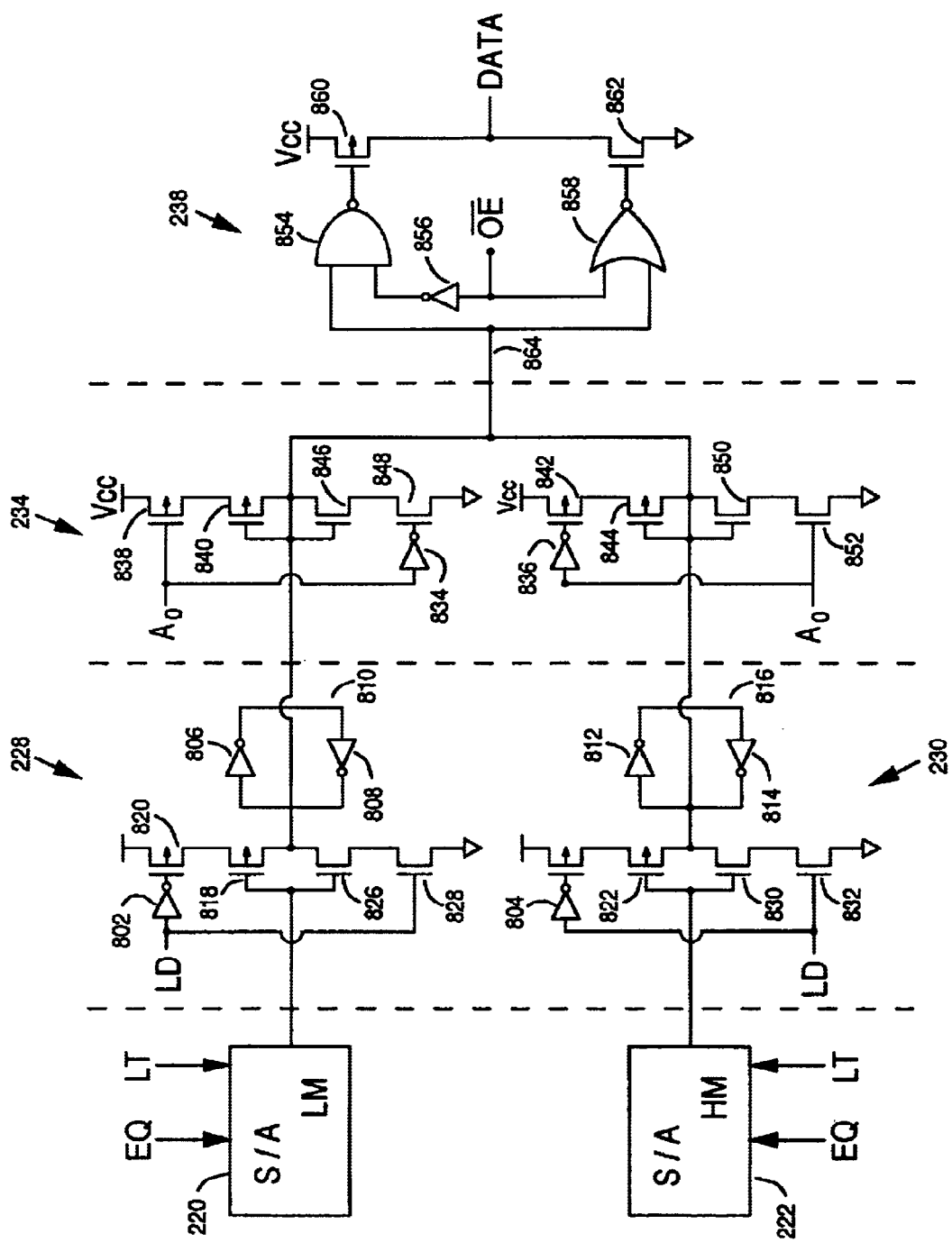
FIG. 11 is a circuit diagram illustrating exemplary sense, latch, and output circuitry according to the memory of FIG. 2.

Referring now to FIG. 11, it is a circuit diagram of exemplary sense, latch, and output circuitry according to the memory 200 of FIG. 2. The circuitry is illustrated in more detail for a bit of a high data word and for a bit of a low data word. The sense, latch, and output circuitry includes, from FIG. 2, the sense amplifier $S/A_{LM}$ 220 of the first series of sense amplifiers $S/A_{LO}$ 216 . . . $S/A_{LM}$ 220, the sense amplifier $S/A_{HM}$ 222 of the second series of sense amplifiers $S/A_{HO}$ 218 . . . $S/A_{HM}$ 222, the latches LATCHLM 228 and LATCHHM 230 of the series of latches beginning with $LATCH_{LO}$ 224 and $LATCH_{HO}$ 226 and ending with $LATCH_{LM}$ 228 and $LATCH_{HM}$ 230, the data multiplexer $M_M$ 234 of the series of data multiplexers beginning with $M_0$ 232 and ending with $M_M$ 234, and the output buffer OUTBUF$_M$ 238 of the series of output buffers beginning with OUTBUF$_0$ 236 and ending with OUTBUF$_M$ 238. Preferably, the latch LATCHLM 228 includes a latch 810, p-channel transistors 818, 820 and n-channel transistors 826, 828 utilized as switching logic, and an inverter 802. Preferably, the latch 810 includes a pair of inverters 806, 808. Preferably, the latch LATCHHM 230 includes a latch 816, p-channel transistors 822, 824 and n-channel transistors 830, 832 utilized as switching logic, and an inverter 804. Preferably, the latch 816 includes a pair of inverters 812, 814. Preferably, the data multiplexer $M_M$ 234 includes p-channel transistors 838, 840, 842, 844 and n-channel transistors 846, 848, 850, 852 utilized as switching logic, and inverters 834, 836. Preferably, the output buffer OUTBUF$_M$ 238 includes an AND gate 854, a NOR gate 858, a p-channel transistor 860, an n-channel transistor 862, and an inverter 856.

The EQ signal and the LT signal are both generated by the timing control circuit 210 and are provided to the sense amplifier $S/A_{LM}$ of the first series of sense amplifiers and to the sense amplifier $S/A_{HM}$ of the second series of sense amplifiers. The LD signal is generated by the timing control circuit 210 and is provided to the latches $LATCH_{LM}$ 228 and $LATCH_{HM}$ 230. The control signal $A_0$ is generated by the address buffer block 208 and is provided to the data multiplexer $M_M$ 234. Preferably, the data multiplexer $M_M$ 234 selects a bit of a low or a high data word according to the transition of the control signal $A_0$. The output enable signal $\overline{OE}$ is applied at an input, preferably an external input, of the memory 200 and is received at the output buffer OUTBUF$_M$ 238. The output buffer OUTBUF$_M$ 238 receives a bit of a high or a low data word of memory at a node 864. Preferably, the output buffer 238 produces one bit DATA$_M$ of the multiple-bit data word signal DATA, responsively to the $\overline{OE}$ signal, at an output of the memory 200 for use external to the memory 200. Typically, the DATA signal will correspond to the information stored in a series of core memory cells addressable as data words of the memory 200. Preferably, the bit DATA$_M$ of the DATA signal alternates between a bit of a high data word and a bit of a low data word in accordance with the control signal $A_0$ and the $\overline{OE}$ signal.

The operation of the clock counter circuit 212 will be apparent to those skilled in the art. In addition, the signals EQ, LT, LD, $A_0$, DATA, and $\overline{OE}$ are illustrated in the timing diagram of FIG. 3. A pulse of the EQ signal turns on the sense amplifiers $S/A_{LM}$ 220 and $S/A_{HM}$ 222 to access a bit of a low data word and a bit of a high data word, respectively, by sense the information stored in core memory cells addressable as data words of the memory 200. The EQ signal going low triggers a pulse of the LT signal. A rising edge of the LT signal moves the bit of the low data word into a latch stage located within the sense amplifier $S/A_{LM}$ 220 and the bit of the high data word into a latch stage located within the sense amplifier $S/A_{HM}$ 222. A falling edge of the LT signal latches or stores the bit of the low data word and the bit of the high data word in the respective latch stages in the respective sense amplifiers 220, 222. The data word bits from the sense amplifiers 220, 222 will be loaded to the applicable latches 228, 230 with the LD signal. The latched data word bits are then selected with the control signal $A_0$ at the data multiplexer $M_M$ 234. If the control signal $A_0$ is low, the low data word bit from $S/A_{LM}$ 220 will be selected. If the control signal $A_0$ is high, the high data word bit from $S/A_{HM}$ 222 will be selected. Coupled to the data multiplexer $M_M$ 234 at the node 864 is the output buffer OUTBUF$_M$ 238, which includes logic gates 858, 854 that receive the output enable signal $\overline{OE}$ and the complement $\overline{OE}$, respectively. When the $\overline{OE}$ signal is high, the transistors 860, 862 are off, and the bit DATA$_M$ of the DATA signal is available or is not valid. When the $\overline{OE}$ signal is low, the output functions are enabled, and the bit DATA$_M$ of the DATA signal produced at the output of the output buffer 238 is equivalent to the bit of the high or low data word that was selected with the control signal $A_0$ at the data multiplexer $M_M$ 234.

It should be understood that the addresses such as the initial address signal ADD and the present address signal ADDP of the memory 200 are generally multiple-bit signals, since the selection of a particular core cell or cells in memory requires a corresponding multiple-bit address. However, in the presently preferred embodiments, circuitry may be described with reference to particular bits of the multiple-bit address. It will be evident in such instances to those skilled in the art to apply and extend the concepts illustrated by the circuitry to multiple-bit implementations. Those skilled in the art will appreciate that such implementations might include parallel implementations, including instances where circuitry for one bit is duplicated in parallel for each bit of a multiple-bit address as required. Other implementations might include presenting all or some of the multiple address bits together to achieve the desired result or function.

In one embodiment, all of the components of FIG. 2 are contained on a single integrated circuit chip. Note that address and control inputs for the exemplary flash memory chips are dependent on memory density and interface implementations. It will be appreciated that the disclosed embodiments can work with different memory densities and alternate interface implementations with their accompanying alternate address and control input configurations.

As used herein, the term access is intended broadly to refer to the retrieval and/or sensing of data from core cells in a core cell memory array, the core cells preferably being addressable as data words. The term access may refer to providing an address to a decoder or decoding logic to identify and reach one or more core cells in memory, as performed by address buffer circuitry, for example. Similarly, the term access may likewise refer to sensing data, preferably in the form of data words, from one or more core cells in memory, as performed by sense amplifier circuitry. In a preferred embodiment, the access further includes storing data, preferably in the form of data words, from one or more core cells in memory, so that a subsequent access may begin while retaining data from a prior access. A first or initial access, a second access, and subsequent accesses are described herein.

As used herein, the term inversion delay stage is intended broadly to refer to a delay stage with an inversion operation. A delay stage with an inversion operation may be implemented, for example, with an odd number of inverters placed in series. For example, inversion delay stages including three inverters are described herein and illustrated in FIG. 6. Of course, other delay stages, flip-flops, or suitable circuit elements may be utilized.

It should be understood that the timing diagrams describing the memory 200 and subsidiary circuitry are for illustrative purposes and that for the embodiments described herein, all durations of signal pulses are of a length of time such that the signal pulses are assured of accomplishing their function(s) in an adequate manner.

As used herein, the term present address is intended broadly to refer to any address that uniquely corresponds to, or to the location of, a core memory cell. For example, a present address might refer to a read address that is used exclusively in a read operation, while a present address might elsewhere refer to an address that could be used in a read operation, but could be used in a write operation as well. The embodiments described herein present a burst mode read operation and architecture. However, aspects of the embodiments can be applied with respect to operations other than reading out data such as data words of core cell memory data.

As used herein, the terms and phrases low, logic low, not asserted, not active, and inactive, are intended broadly to refer to logic low values of a digital signal, generally understood to represent a binary zero (0).

As used herein, the terms and phrases high, logic high, asserted, and active are intended broadly to refer to logic high values of a digital signal, generally understood to represent a binary one (1).

As used herein, the phrase "A coupled with B" is defined to mean A directly connected to B, or A indirectly connected with B through one or more intermediate components.

As used herein, the term user is intended to refer to a processor or other component or entity seeking access to memory.

While particular embodiments of the present invention have been shown and described, modifications may be made. For example, the senses of the individual transistors, p-channel and n-channel, may be reversed in suitable applications. It is to be noted that suitable transistor sizes specifying channel width to length ratios (measured in micrometers or microns) for the transistors that make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment. Further, the inventive concepts described herein may be applied to circuits other than memory devices.

It should be understood that, as used herein, the term signal refers broadly to an analog or digital signal and encompasses both types of signals.

From the foregoing, it can be seen that the presently preferred embodiments provide a burst mode architecture to provide burst mode access to a plurality of data words in a memory. The burst mode architecture includes a first circuit, a control circuit coupled to the first circuit, and a data buffer selectively coupled to the first circuit by the control circuit. The first circuit accesses a plurality of data words, beginning with an initial access of a first data word and a second data word. The control circuit generates a timing signal having pulses and a second signal. The second signal is generated upon completion of the initial access of the first data word and the second data word. The first circuit follows the initial access with subsequent accesses of the plurality of data words responsively to the second signal and the timing signal. The data buffer has an output and produces the first data word at the output and successively produces, with each successive pulse of the timing signal following an initial period of time, the second data word, and subsequent data words at the output. The subsequent data words correspond to the subsequent accesses of the plurality of data words.

In a preferred embodiment, the second signal includes the LT signal of FIG. 2. Of course, other signals may be used other than the exemplary LT signal as appropriate. In a preferred embodiment, the timing signal includes both the CLK signal and the CLKI signal. Of course, other signals other than the exemplary CLK signal and CLKI signal may be used for the timing signal as appropriate.

As used herein, the term first circuit is intended broadly to refer to circuitry to access data from memory, preferably data in the form of data words. For example, in a preferred embodiment, the first circuit includes the first series of sense amplifiers beginning with S/A$_{LO}$ 216 and ending with S/A$_{LM}$ 220 and the second series of sense amplifiers beginning with S/A$_{HO}$ 218 and ending with S/A$_{HM}$ 222 of the memory 200 of FIG. 2.

As used herein, the term control circuit is intended broadly to refer to circuitry to generate and produce a variety of signals to perform a variety of burst mode access functions according to the presently preferred embodiments described herein. The signals preferably include timing signals. In some embodiments, the control circuit receives a timing signal external to the memory and produces internal timing signals from the external timing signal. In other embodiments, external timing signals are not directly received by the control circuit. The control circuit can encompass a wide variety of circuitry described herein. For example, the control circuit preferably includes the timing control circuit 210 of the memory 200 of FIG. 2. In other preferred embodiment, the control circuit includes clock buffer 214 as well as the timing control circuit 210 of the memory 200 of FIG. 2. In yet another example according to a preferred embodiment, the control circuit includes the timing control circuit 210, the clock buffer 214, and the clock counter circuit 212 of the memory 200 of FIG. 2.

As used herein, the term data buffer is intended broadly to refer to interface circuitry that facilitates the introduction of data to another circuit or the retrieval of data from another circuit. The data buffer might include, for example, an output buffer, an input buffer. An output buffer might include an output circuit while an input buffer might include an input circuit. For example, in a preferred embodiment, the data buffer includes the series of output buffers beginning with $OUTBUF_0$ 236 and ending with $OUTBUF_M$ 238 of the memory 200 of FIG. 2.

Preferably, the burst mode architecture further includes a clock counter circuit. The clock counter circuit is coupled to the control circuit and measures the initial period of time by counting an initial number of pulses of the timing signal.

Preferably, the burst mode architecture further includes address buffer circuitry. The address buffer circuitry is coupled to and responsive to the control circuit. The address buffer circuitry increments an initial address that corresponds to the first data word and the second data word to generate subsequent addresses to the initial address. Preferably, the first circuit utilizes the subsequent addresses to access the plurality of data words following the initial access.

In addition, the presently preferred embodiments provide a burst mode architecture to provide burst mode access to a plurality of data words in a memory. The burst mode architecture includes a control circuit, a first series of sense amplifiers, a second series of sense amplifiers, address buffer circuitry, and latch circuitry. The first series of sense amplifiers is coupled to the control circuit and accesses a first series of data words of a plurality of data words. The first series of data words are accessed one data word at a time by the first series of sense amplifiers, beginning with an initial access of a first data word, and continuing with a second access of a third data word, and subsequent accesses of the first series of data words of the plurality of data words responsively to the control circuit. The second series of sense amplifiers is coupled to the control circuit and accesses a second series of data words of a plurality of data words. The second series of data words are accessed one data word at a time by the second series of sense amplifiers, beginning with the initial access of a second data word, and continuing with the second access of a fourth data word, and subsequent accesses of the second series of data words of the plurality of data words responsively to the control circuit.

The address buffer circuitry is coupled to and responsive to the control circuit. The address buffer circuitry increments an initial address that corresponds to the first data word and the second data word to generate subsequent addresses to the initial address. The first series of sense amplifiers and the second series of sense amplifiers utilize the subsequent addresses to access the plurality of data words.

The latch circuitry is coupled to the control circuit and is selectively coupled to the first series of sense amplifiers and the second series of sense amplifiers by the control circuit. The latch circuitry stores the first series of data words and the second series of data words. The control circuit directs a transfer of the first series of data words and the second series of data words from the first series of sense amplifiers and the second series of sense amplifiers, respectively, to the latch circuitry. The control circuit triggers the second access of the third data word and the fourth data word responsively upon the completion of the transfer of the first data word and the second data word from the initial access to the latch circuitry.

As used herein, the term latch circuitry is intended broadly to refer to one or more circuits that include one or more latches. For example, in a preferred embodiment, the latch circuitry includes the series of latches beginning with $LATCH_{LO}$ 224 and $LATCH_{HO}$ 226 and ending with $LATCH_{LM}$ 228 and $LATCH_{HM}$ 230 of the memory 200 of FIG. 2.

As used herein, the term latch is intended to refer to a temporary data storage element. A temporary storage element may be implemented, for example, as a pair of inverters (as described and illustrated herein), or as a flip-flop such as a D-type flip-flop.

Preferably, the burst mode architecture further includes an address valid buffer. The address valid buffer has an input and is coupled to the address buffer circuitry. The address valid buffer begins an initial state of the burst mode architecture responsively to an initial address.

Preferably, the burst mode architecture further includes a switching circuit to select a data word from the latch circuitry. Preferably, the switching circuit selects the data word according to whether the data word is one of the first series of data words or is one of the second series of data words. Preferably, the switching circuit selects the data word according to a transition of a control signal. Preferably, the control signal is the least significant bit of the initial address.

As used herein, the term switching circuit is intended broadly to refer to any of a variety of switching mechanisms used to toggle the value of an output C between the values of an input A and an input B. A data multiplexer may be organized as a 2 to 1 switching circuit. For example, in a preferred embodiment, the switching circuit includes the series of data multiplexers beginning with $M_0$ 232 and ending with $M_M$ 234 of the memory 200 of FIG. 2.

Preferably, the burst mode architecture further includes a data buffer, a clock buffer, and a clock counter circuit. The data buffer has an output and is coupled to the switching circuit. The clock buffer generates a timing signal having pulses, while the clock counter circuit, coupled to the clock buffer, measures an initial period of time by counting an initial number of pulses of the timing signal. The data buffer successively produces, preferably with each successive pulse of the timing signal following an initial period of time, the second data word, the third data word, the fourth data word, and subsequent data words at the output. The subsequent data words correspond to the first series of data words and the second series of data words of the plurality of data words.

Further, the presently preferred embodiments provide a method of providing burst mode access to a plurality of data words in a memory. An initial period of time is measured responsively to an initial address by counting an initial number of pulses of a timing signal. Within the initial period of time, a first data word and a second data word are accessed with the initial address, a second signal is subsequently generated, the initial address is incremented to generate a second address, and a third data word and a fourth data word are accessed with the second address responsively to the second signal. Preferably, the first data word and the second data word are stored responsively to the second signal. Following the initial period of time, the first data word is produced at an output of the memory responsively to a first pulse of the timing signal, and the second data word is produced at the output of the memory responsively to a second pulse of the timing signal.

In addition, the presently preferred embodiments provide a method of providing burst mode access to a plurality of data words in a memory. Preferably, the plurality of data words is stored in a plurality of core memory cells of the memory. An initial period of time is measured responsively to an initial address by counting an initial number of pulses of a timing signal. Within the initial period of time, a first data word and a second data word are accessed with the initial address, a second signal is subsequently generated, the initial address is incremented to generate a second address, the first data word and the second data word are stored responsively to the second signal, and a third data word and a fourth data word are accessed with the second address responsively to the second signal. Following the initial period of time, the first data word is produced at an output of the memory responsively to a first pulse of the timing signal, the second data word is produced at the output of the memory responsively to a second pulse of the timing signal, and the third and the fourth data word are stored responsively to the second pulse of the timing signal. For successive pulses of the timing signal, a subsequent address is generated with every two pulses of the timing signal, two data words are accessed for every subsequent address with every two pulses of the timing signal, two data words are stored with every two pulses of the timing signal, and one data word is produced at the output of the memory with every pulse of the timing signal.

It should be understood that the steps of the methods recited herein can be performed in any order consistent with the recited acts.

The foregoing detailed description has described only a few of the many forms that this invention can take. It is therefore intended that the foregoing detailed description be regarded as illustrative rather than limiting, and that it be understood that it is the following claims, including all equivalents, which are intended to define the spirit and scope of this invention. It is therefore intended in the appended claims to cover all such changes and modifications which fall within the true spirit and scope of the invention.

We claim:

1. A burst mode architecture for a flash memory device to provide burst mode access to a plurality of data words in a memory, the architecture comprising:
   a core cell array comprising a plurality of non-volatile memory cells;
   a first circuit coupled to said core cell array for accessing a plurality of data words, beginning with an initial access of a first data word and a second data word;
   a control circuit coupled to the first circuit and generating a timing signal having pulses, and a second signal upon completion of the initial access of the first data word and the second data word, and wherein the first circuit follows the initial access with subsequent accesses of the plurality of data words responsively to the second signal and the timing signal; and
   a data buffer having an output and selectively coupled to the first circuit by the control circuit, the data buffer producing the first data word at the output and successively producing, with each successive pulse of the timing signal following an initial period of time, the second data word, and subsequent data words at the output, the subsequent data words corresponding to the subsequent accesses of the plurality of data words.

2. The burst mode architecture of claim 1, further comprising:
   a clock counter circuit, coupled to the control circuit, to measure the initial period of time by counting an initial number of pulses of the timing signal.

3. The burst mode architecture of claim 1, further comprising:
   address buffer circuitry coupled to and responsive to the control circuit to increment an initial address that corresponds to the first data word and the second data word to generate subsequent addresses to the initial address, the first circuit utilizing the subsequent addresses to access the plurality of data words following the initial access.

4. The burst mode architecture of claim 1, wherein the plurality of data words is stored in a plurality of core memory cells of the memory.

5. A burst mode architecture to provide burst mode access to a plurality of data words in a memory, the architecture comprising:
   control circuit;
   a first series of sense amplifiers to access a first series of data words of a plurality of data words, the first series of sense amplifiers coupled to the control circuit, wherein the first series of data words are accessed one data word at a time by the first series of sense amplifiers, beginning with an initial access of a first data word, and continuing with a second access of a third data word, and subsequent accesses of the first series of data words of the plurality of data words responsively to the control circuit;
   a second series of sense amplifiers to access a second series of data words of the plurality of data words, the second series of sense amplifiers coupled to the control circuit, wherein the second series of data words are accessed one data word at a time by the second series of sense amplifiers, beginning with the initial access of a second data word, and continuing with the second access of a fourth data word, and subsequent accesses of the second series of data words of the plurality of data words responsively to the control circuit;
   address buffer circuitry coupled to and responsive to the control circuit to increment an initial address that corresponds to the first data word and the second data word to generate subsequent addresses to the initial address, the first series of sense amplifiers and the second series of sense amplifiers utilizing the subsequent addresses to access the plurality of data words; and
   latch circuitry coupled to the control circuit and selectively coupled to the first series of sense amplifiers and the second series of sense amplifiers by the control circuit to store the first series of data words and the second series of data words, the control circuit directing a transfer of the first series of data words and the second series of data words from the first series of sense amplifiers and the second series of sense amplifiers, respectively, to the latch circuitry;
   wherein the control circuit triggers the second access of the third data word and the fourth data word responsively upon the completion of the transfer of the first data word and the second data word from the initial access to the latch circuitry.

6. The burst mode architecture of claim 5, further comprising:
   an address valid buffer having an input and coupled to the address buffer circuitry to begin an initial state of the burst mode architecture responsively to the initial address.

7. The burst mode architecture of claim 5, further comprising:
   a switching circuit to select a data word from the latch circuitry according to whether the data word is one of the first series of data words or is one of the second series of data words.

8. The burst mode architecture of claim 5, further comprising:
   a switching circuit to select a data word from the latch circuitry according to a transition of a control signal, wherein the control signal is the least significant bit of the initial address.

9. The burst mode architecture of claim 5, further comprising:
a switching circuit to select a data word from the latch circuitry; and
a data buffer having an output and coupled to the switching circuit, the data buffer successively producing the first data word, the second data word, the third data word, the fourth data word, and subsequent data words at the output, the subsequent data words corresponding to the first series of data words and the second series of data words of the plurality of data words.

10. The burst mode architecture of claim 9, further comprising:
a clock buffer to generate a timing signal having pulses; and
a clock counter circuit, coupled to the clock buffer, to measure an initial period of time by counting an initial number of pulses of the timing signal;
the data buffer successively producing, with each successive pulse of the timing signal following an initial period of time, the second data word, the third data word, the fourth data word, and subsequent data words at the output.

11. The burst mode architecture of claim 5, wherein the plurality of data words is stored in a plurality of core memory cells of the memory.

12. In a flash memory device comprising an array of non-volatile memory cells, a method of providing burst mode access to a plurality of data words, the method comprising:
measuring an initial period of time responsively to an initial address by counting an initial number of pulses of a timing signal, and, within the initial period of time:
accessing a first data word and a second data word with the initial address;
subsequently generating a second signal;
incrementing the initial address to generate a second address;
accessing a third data word and a fourth data word with the second address responsively to the second signal; and,
following the initial period of time;
producing the first data word at an output of the memory responsively to a first pulse of the timing signal; and
producing the second data word at the output of the memory responsively to a second pulse of the timing signal.

13. The method of claim 12, further comprising: within the initial period of time:
storing the first data word and the second data word responsively to the second signal.

14. The method of claim 12, wherein the plurality of data words is stored in a plurality of core memory cells of the memory.

15. In a memory, a method of providing burst mode access to a plurality of data words, the method comprising:
measuring an initial period of time responsively to an initial address by counting an initial number of pulses of a timing signal, and, within the initial period of time:
accessing a first data word and a second data word with the initial address;
subsequently generating a second signal;
incrementing the initial address to generate a second address;
storing the first data word and the second data word responsively to the second signal;
accessing a third data word and a fourth data word with the second address responsively to the second signal; and,
following the initial period of time:
producing the first data word at an output of the memory responsively to a first pulse of the timing signal;
producing the second data word at the output of the memory responsively to a second pulse of the timing signal;
storing the third data word and the fourth data word responsively to the second pulse of the timing signal; and,
for successive pulses of the timing signal:
generating a subsequent address with every two pulses of the timing signal;
accessing two data words for every subsequent address with every two pulses of the timing signal;
storing two data words with every two pulses of the timing signal; and
producing one data word at the output of the memory with every pulse of the timing signal.

16. The method of claim 15, wherein the plurality of data words is stored in a plurality of core memory cells of the memory.

* * * * *